US011270900B2

(12) United States Patent
Kuo et al.

(10) Patent No.: US 11,270,900 B2
(45) Date of Patent: Mar. 8, 2022

(54) APPARATUS AND METHOD FOR HANDLING WAFER CARRIER DOORS

(71) Applicant: Taiwan Semiconductor Manufacturing Co., Ltd., Hsin-Chu (TW)

(72) Inventors: Tsung-Sheng Kuo, New Taipei (TW); Yang-Ann Chu, Hsin-Chu (TW); Alan Yang, Hsin-Chu (TW); Vic Huang, Hsin-Chu (TW); Hsu-Shui Liu, Pingjhen (TW); Jiun-Rong Pai, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/834,290

(22) Filed: Mar. 30, 2020

(65) Prior Publication Data
US 2020/0227283 A1 Jul. 16, 2020

Related U.S. Application Data

(63) Continuation of application No. 15/883,473, filed on Jan. 30, 2018, now Pat. No. 10,622,236.

(60) Provisional application No. 62/552,280, filed on Aug. 30, 2017.

(51) Int. Cl.
*H01L 21/677* (2006.01)
*H01L 21/683* (2006.01)
*H01L 21/68* (2006.01)

(52) U.S. Cl.
CPC ...... *H01L 21/677* (2013.01); *H01L 21/67733* (2013.01); *H01L 21/67736* (2013.01); *H01L 21/67772* (2013.01); *H01L 21/681* (2013.01); *H01L 21/683* (2013.01)

(58) Field of Classification Search
CPC ......... H01L 21/67733; H01L 21/67772; H01L 21/67775
See application file for complete search history.

(56) References Cited

U.S. PATENT DOCUMENTS

| | | | | |
|---|---|---|---|---|
| 6,030,208 A | * | 2/2000 | Williams | H01L 21/67769 414/153 |
| 7,806,643 B2 | * | 10/2010 | Friedman | H01L 21/67775 414/222.01 |
| 9,368,382 B2 | * | 6/2016 | Friedman | H01L 21/67775 |
| 9,378,995 B2 | | 6/2016 | Bonora | |
| 9,543,178 B2 | | 1/2017 | Lee | |
| 9,991,143 B2 | | 6/2018 | Takai | |
| 10,037,908 B2 | | 7/2018 | Ota | |
| 10,083,847 B2 | | 9/2018 | Tomida | |

(Continued)

FOREIGN PATENT DOCUMENTS

JP 2004-015306 A 1/2004

*Primary Examiner* — Kaitlin S Joerger
(74) *Attorney, Agent, or Firm* — Duane Morris LLP

(57) ABSTRACT

An apparatus for handling wafer carriers in a semiconductor fabrication facility (FAB) is disclosed. In one example, the apparatus includes: a table configured to receive a wafer carrier having a first door and operable to hold a plurality of wafers; an opening mechanism configured to open the first door of the wafer carrier; and a door storage space configured to store the first door. The apparatus may be either located on a floor of the FAB or physically coupled to a ceiling of the FAB.

20 Claims, 19 Drawing Sheets

(56) References Cited

U.S. PATENT DOCUMENTS

| | | |
|---|---|---|
| 10,153,189 B2 | 12/2018 | Takai |
| 10,186,442 B2 | 1/2019 | Takai |
| 10,332,766 B2 * | 6/2019 | Sasaki ............... H01L 21/67757 |
| 10,672,639 B2 * | 6/2020 | Kuo .......................... B66C 1/62 |
| 10,854,490 B2 * | 12/2020 | Kuo ................. H01L 21/67742 |
| 10,964,574 B2 * | 3/2021 | Kuo ................. H01L 21/67775 |
| 2003/0051972 A1 * | 3/2003 | Davis ............... H01L 21/67754 |
| | | 198/345.3 |
| 2007/0110548 A1 * | 5/2007 | Oyama ............ H01L 21/67772 |
| | | 414/416.08 |
| 2008/0112784 A1 | 5/2008 | Rogers |
| 2009/0092468 A1 * | 4/2009 | Oyama ............ H01L 21/67017 |
| | | 414/222.01 |
| 2010/0003111 A1 * | 1/2010 | Yeo .................. H01L 21/67769 |
| | | 414/222.07 |
| 2014/0369793 A1 | 12/2014 | Hall |
| 2015/0203333 A1 | 7/2015 | Ota |
| 2016/0111310 A1 * | 4/2016 | Koike .................... B65G 51/03 |
| | | 414/217 |
| 2016/0336209 A1 | 11/2016 | Yoshioka |
| 2016/0365264 A1 * | 12/2016 | Tokunobu ......... H01L 21/67109 |
| 2017/0178942 A1 | 6/2017 | Sakata |
| 2018/0158708 A1 | 6/2018 | Kuo |

* cited by examiner

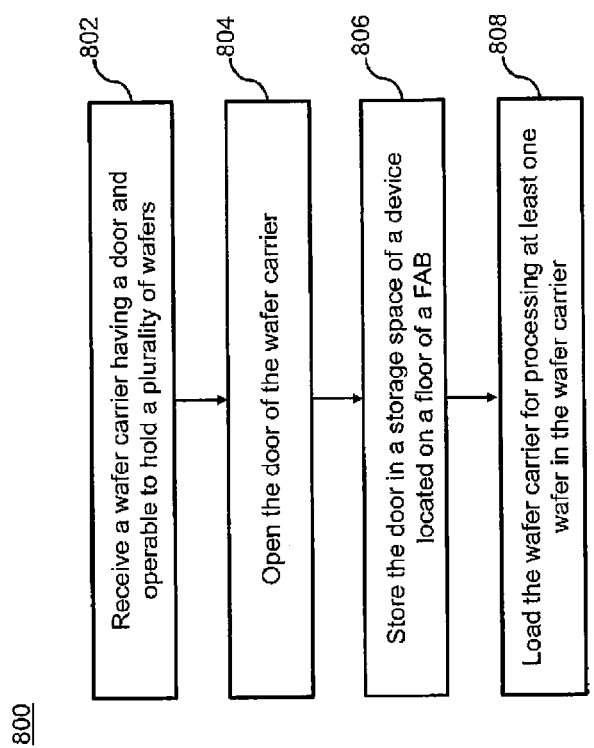

APPARATUS AND METHOD FOR HANDLING WAFER CARRIER DOORS

CROSS-REFERENCE TO RELATED APPLICATION

This application is a continuation application of U.S. patent application Ser. No. 15/883,473, filed Jan. 30, 2018, which claims priority to U.S. Provisional Patent Application No. 62/552,280, filed on Aug. 30, 2017, each of which is incorporated by reference herein in their entireties.

BACKGROUND

During manufacturing of a semiconductor device, the device is usually processed at many work stations or processing machines. The transporting or conveying of a partially finished device, or a work-in-process (WIP) part, is an important aspect in the total manufacturing process. The conveying of semiconductor wafers is especially important in the manufacturing of integrated circuit (IC) chips due to the delicate nature of the chips. Furthermore, in fabricating an IC product, a multiplicity of fabrication steps, i.e. as many as several hundred, is usually required to complete the fabrication process. A semiconductor wafer or IC chips must be stored or transported between various process stations in order to perform various fabrication processes.

Automated Material Handling Systems (AMHS) have been widely used in semiconductor fabrication facilities ("FABs") to automatically handle and transport groups or lots of wafers between various processing machines ("tools") used in chip manufacturing. Multiple wafers are typically stored and transported together in wafer carriers by the AMHS between load ports of different wafer processing or other tools during the semiconductor fabrication process. The load port is used to handle not only semiconductor wafers but also different types of substrates to be processed such as liquid crystal display glass substrates and photomask glass substrates.

The AMHS in a semiconductor FAB includes numerous types of automated and manual vehicles for moving and transporting the wafer carriers throughout the FAB during the manufacturing process. This can include for example automatic guided vehicles (AGVs), personal guided vehicles (PGVs), rail guided vehicles (RGVs), overhead shuttles (OHSs), and overhead hoist transports (OHTs). Of the foregoing AMHS wafer transport mechanisms, OHTs are commonly used to transport wafer carriers, from the load port of one tool to the load port of the next tool in the processing sequence. A wafer carrier transported by an OHT transfer system typically has a door during the transfer process for production quality control, e.g. to seal the wafer carrier against entry of external contaminants to keep wafers inside the wafer carrier clean, and/or to protect the wafers from falling off the wafer carrier.

A conventional load port is used to load and unload a wafer carrier in a FAB. But it needs a human being to manually open the door of the wafer carrier and put the wafer carrier into the load port, which causes a bottle neck of work efficiency in the FAB. As such, an apparatus and method for handling wafer carrier doors to solve the above mentioned problems is desired.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

FIG. 8 is a flow chart illustrating an exemplary method for handling wafer carriers, in accordance with some embodiments of the present disclosure.

DETAILED DESCRIPTION

Figure 1:
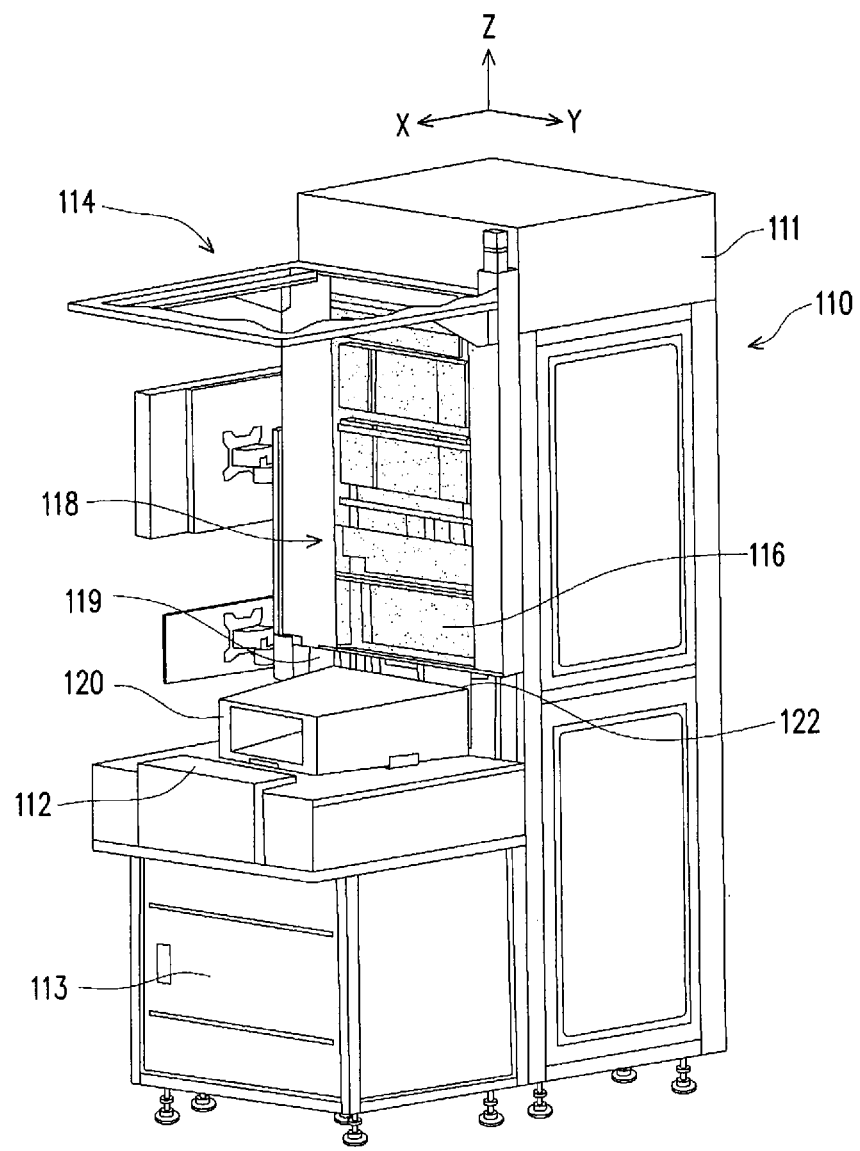
FIG. 1 illustrates an exemplary load port with door opening, closing and storage mechanisms, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

A typical FAB generally includes one or more floors having a plurality of process bays including processing, metrology, and inspection tools and wafer staging equipment such as stockers which are interconnected by an AMHS, which is computer controlled for handling the staging of wafers for processing and flow of wafer traffic in the FAB. Multiple wafers are typically stored and transported together in wafer carriers by the AMHS between load ports of different wafer processing or other tools during the semiconductor fabrication process. The wafer carriers include standard mechanical interface (SMIF) pods which can hold a plurality of wafers (e.g. 200 mm or 8 inch), or front opening unified pods (FOUPs) which can hold larger 300 mm (12 inch) or 450 mm (18 inch) wafers. Typically, each wafer carrier holds on the order of approximately 25 wafers.

An OHT transfer system is commonly used to transport wafer carriers, such as FOUPs or SMIFs, from the load port of one tool to the load port of the next tool in the processing sequence. An OHT system includes "vehicles" that travel on an overhead monorail of the AMHS. The OHT vehicle on-board hoist is operable to raise and lower wafer carriers allowing the OHT vehicle to deposit and retrieve wafer carriers from the load ports of tools positioned along and on the floor beneath the overhead rail. A wafer carrier transported by an OHT transfer system typically has a door during the transfer process for production quality control.

To improve production quality and save operation human resource, the present disclosure introduces an apparatus that can automatically open and close a door of a wafer carrier, and store the door in a door storage space when the wafer carrier is loaded for wafer processing.

In some embodiments, the apparatus is a load port located on a floor of a FAB. The load port can hold the door opened from the wafer carrier and close it back to the wafer carrier after wafer processing, without moving the door to the door storage. In this case, the load port handles wafer carriers in series. In other embodiments, the load port moves the doors opened from wafer carriers to the door storage, so that the load port can handle wafer carriers in parallel and the opening mechanism does not need to hold the door and wait for the wafers to be processed.

In one embodiment, after a table of the load port receives a wafer carrier, e.g. from a transport tool like OHT, the load port has an opening mechanism to automatically open the door of the wafer carrier and move the door to a door storage unit for storing the door, while a controller of the load port controls the table to load the opened wafer carrier for wafer processing. The load port may also have a closing mechanism to automatically retrieve a door from the storage and close the door onto the wafer carrier after the wafer processing. The retrieved door may not be the original door of the wafer carrier before the wafer carrier is loaded, but may have a same model as the original door to fit the wafer carrier.

In some embodiments, the opening mechanism and the closing mechanism are coupled together or combined together. The opening/closing mechanism and the door storage space may be installed on an existing load port, e.g. a multi-cassette load port (MCLP), that is located on a floor of a FAB. The opening/closing mechanism may include: a vacuum pin to hold the door, a latch key to open/close the door, and a moving mechanism to move the door to or from the door storage. The door storage may include one or more storage units each for storing a wafer carrier door. The moving mechanism can fix the door to a door storage unit, e.g. by an alignment pin.

In some embodiments, the door storage units are covered by a transparent plate, such that an operator standing in front of the load port can see the doors stored in the storage units that are located behind and above the table. The load port may include a plurality of buffering spaces to buffer the wafer carriers before any wafer in the buffered wafer carriers is processed. From the operator's point of view, the plurality of buffering spaces may be located at the back side of the wafer carrier, at the left side of the wafer carrier, or at the right side of the wafer carrier, according to various embodiments. Corresponding, the table may be configured to move the wafer carrier into a buffering space, from front to back, from left to right, or from right to left, according to various embodiments.

The apparatus may also include a light shutter to capture light information of a wafer transport path between the light shutter and the table, and a sensor, e.g. an E84 sensor, to detect an obstacle on the wafer transport path based on the light information and inform the OHT about the detected obstacle, and thereafter stop the OHT from transferring wafer carriers onto the table.

In some embodiment, the apparatus has one or more holding mechanisms configured to hold the apparatus to a ceiling of a FAB. In this case, the apparatus is called a "sky port" and may be separate from a load port that loads the wafer carrier for wafer processing. The sky port can automatically open and close a door of a wafer carrier, and store the door in a door storage space when the wafer carrier is loaded by the load port. In one example, a bottom portion of the sky port is higher than a top portion of the load port. In another example, the sky port is located right above the load port.

The present disclosure is applicable to all kinds of devices that deal with a wafer carrier having a door. The disclosed apparatus can automatically map each wafer carrier to a door; and automatically control the process flow including door opening, storing, and closing, to save human operation resources and reduce human errors on the manufacturing floor. In one example, the apparatus can save floor area of a FAB by being installed on a ceiling of the FAB.

FIG. 1 illustrates an exemplary load port 110 with door opening, closing and storage mechanisms, in accordance with some embodiments of the present disclosure. As shown in FIG. 1, the load port 110 includes a housing 111, a table 112, a light shutter 114, a door opening/closing mechanism 116, and a door storage space 118. The load port 110 may be located on a floor of a FAB for handling wafer carriers.

The table 112 may be configured to receive a wafer carrier 120 from a transport tool, e.g. a vehicle of an OHT that is physically coupled to a ceiling of the FAB and is located higher than the table 112. The wafer carrier 120 has a door 122 on the back of the wafer carrier 120, i.e. on the side facing the housing 111.

The door opening/closing mechanism 116 in this example is coupled to the housing 111 and located at the front side of the housing 111, i.e. at the side facing the wafer carrier 120. The door opening/closing mechanism 116 may be configured to open the door 122 of the wafer carrier 120, e.g. by a latch key and vacuum pin, and move the door 122 away from the wafer carrier 120 toward the back of the wafer carrier 120 along the −X direction as shown in FIG. 1. The door opening/closing mechanism 116 may then hold the door 122 and move it up along the Z direction to the door storage 118.

The door storage 118 in this example is coupled to the housing 111 and located at the front side of the housing 111, i.e. at the side facing the wafer carrier 120. The door storage 118 may be physically connected to the door opening/closing mechanism 116. The door opening/closing mechanism 116 is movable relative to the door storage space 118, along the Z and −Z directions. The door storage 118 in this example includes four door storage units. It can be understood that a door storage space may include one or more door storage units for storing wafer carrier doors. For example, after moving the door 122 up to one of the door storage units, the door opening/closing mechanism 116 may rotate door pin by the latch key to fix the door 122 into the door storage unit. The door 122 is stored in the door storage unit while the wafer carrier 120 is loaded for wafer processing.

The light shutter 114 in this example is coupled to the housing 111 and located at the front side of the housing 111 and above the table 112. The wafer carrier 120 is transported by a transport tool, e.g. an OHT, from up of the load port 110 along the −Z direction, through the light shutter 114 and down to the table 112. The light shutter 114 can capture light information of a wafer transport path between the light shutter 114 and the table 112. Because any wafer carrier is received by the table 112 through the wafer transport path, if there is any object or obstacle located on the wafer transport path, continuing transporting wafer carriers may cause a collision. As such, a sensor (not shown), e.g. an E84 sensor, that is electrically connected to the light shutter 114 may determine whether there is an obstacle on the wafer transport path based on the light information captured by the light shutter 114 and send a signal to the OHT, to stop OHT from transporting any more wafer carrier onto the table 112, until the wafer transport path is clear and has no obstacle. For example, after an E84 sensor connected to the light shutter 114 determines that there is an obstacle between the light shutter 114 and the table 112, the E84 sensor may inform another sensor, e.g. an E87 sensor, connected to the OHT, about the obstacle to stop OHT from transporting wafer carriers to the table 112. Then, after the light information reflects that obstacle is gone and the wafer transport path is clear, the E84 sensor may inform the E87 sensor with another signal, to ask the OHT to continue transporting wafer carriers to the table 112.

The housing 111 has an input gateway 119 facing the back side of the wafer carrier 120. The table 112 is movable relative to the housing 111. In one embodiment, the load port 110 also includes a controller 113. The controller 113 may control the table 112 to move the wafer carrier 120 through the input gateway 119 and into a buffering space along the −X direction, i.e. to load the wafer carrier 120 into the buffering space for a processing tool to process at least one wafer in the wafer carrier 120.

A processing tool (not shown in FIG. 1) may be coupled to the load port 110 for retrieving and processing at least one wafer in the wafer carrier 120 whose door has been opened and stored in the door storage space 118. The processing tool may be a manufacturing apparatus, a visual inspection apparatus, an electrical characteristic test apparatus, etc.

In accordance with various embodiments, the controller 113 may be disposed under the table 112 as shown in FIG. 1, or disposed within the housing 111, or disposed at other places of the load port 110. The controller 113 may be electrically or mechanically connected to the table 112 for controlling the table 112. After the processing tool finishes processing the at least one wafer in the wafer carrier 120, the controller 113 may control the table 112 to unload the wafer carrier 120 from the buffering space.

After the wafer carrier 120 is unloaded, the door opening/closing mechanism 116 may be configured to retrieve a door from the door storage space 118. The retrieved door may be the original door 122 of the wafer carrier 120 before the wafer carrier 120 is loaded, or may be another door having a same model as the original door 122 to fit the wafer carrier 120. The door opening/closing mechanism 116 may hold and move down the retrieved door along the −Z direction from the corresponding storage unit and close the retrieved door onto the wafer carrier 120, e.g. by a latch key and vacuum pin. The OHT may then transport the unloaded wafer carrier 120 to another load port for further processing of the one or more wafers in the wafer carrier 120.

In addition to a simple load port supporting one cassette or one wafer carrier at a time, as described above, the present teaching is also applicable to a multi-cassette load port (MCLP). When the load port 110 is a MCLP, multiple buffering spaces (not shown in FIG. 1) are movably disposed in the housing 111. For wafer carrier loading, the controller 113 may first control the plurality of buffering spaces to move up or down along the Z or −Z direction, such that one of the buffering spaces is aligned with the table 112. The controller 113 may then control the table 112 to move the wafer carrier 120 through the input gateway 119 and into an aligned buffering space along the −X direction, i.e. to load the wafer carrier 120 into the aligned buffering space for a processing tool to process at least one wafer in the wafer carrier 120. The processing tool (not shown in FIG. 1) may be coupled to the load port 110 for retrieving and processing wafers in the wafer carriers (whose doors have been opened and stored in the door storage space 118) that are buffered in the plurality of buffering spaces in the housing 111. The processing tool may be a manufacturing apparatus, a visual inspection apparatus, an electrical characteristic test apparatus, etc.

For wafer carrier unloading of the MCLP, after the processing tool finishes processing the at least one wafer in the wafer carrier 120, the controller 113 may control the table 112 to unload the wafer carrier 120 from the aligned buffering space. It can be understood that since there are multiple wafer carriers buffered in the buffering spaces of the MCLP waiting for wafer processing, the previously aligned buffering space may be misaligned with the table 112. In this case, the controller 113 may first control the buffering spaces to move up or down along the Z or −Z direction to realign the previously aligned buffering space with the table 112, before controlling the table 112 to unload the wafer carrier 120 from the realigned buffering space.

The operations of the light shutter 114, the door opening/closing mechanism 116 and the door storage space 118 in the MCLP may be same or similar to what have been described for the simple load port described above.

In accordance with the embodiment shown in FIG. 1, the housing 111 including the plurality of buffering spaces is located at the back side of the wafer carrier 120, from an operator's point of view when the operator is standing in front of the load port 110 and facing the door storage space 118. In this case, the table 112 is configured to move the wafer carrier 120 into a buffering space from front to back, from the operator's point of view.

Figure 2A:
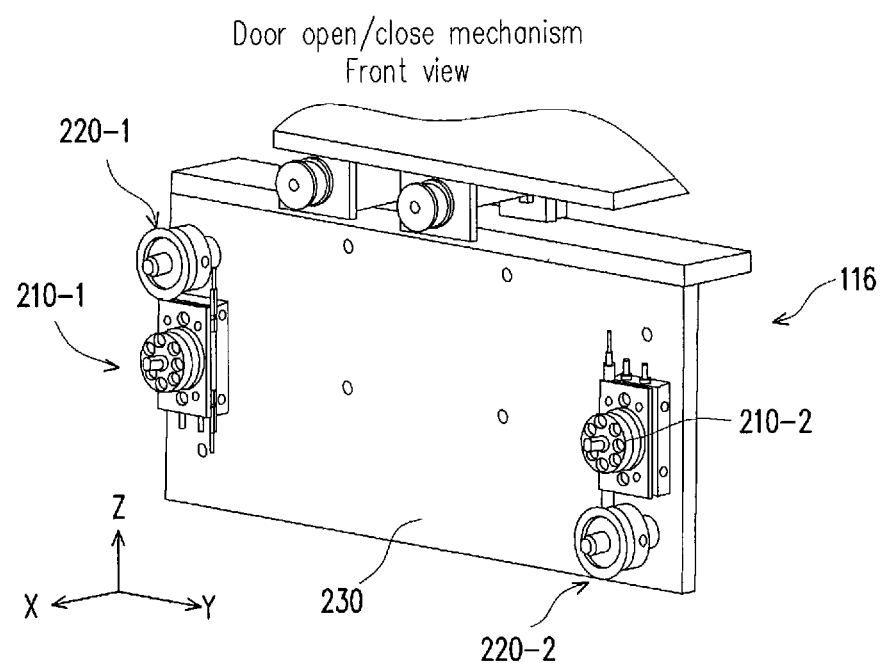
FIG. 2A illustrates a front view of an exemplary door opening/closing mechanism in the load port shown in FIG. 1, in accordance with some embodiments of the present disclosure.
Figure 2B:
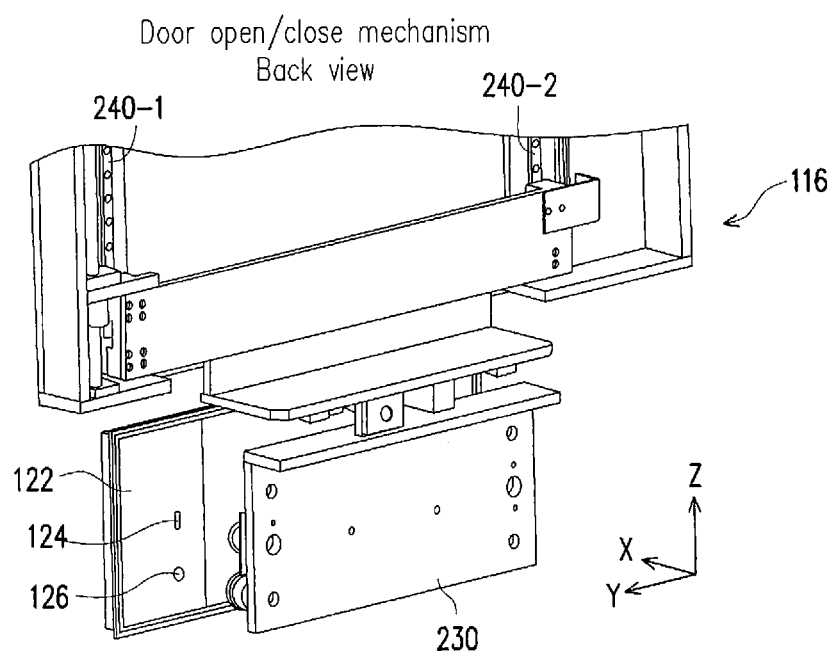
FIG. 2B illustrates a corresponding back view of the exemplary door opening/closing mechanism shown in FIG. 2A, in accordance with some embodiments of the present disclosure.

FIG. 2A illustrates a front view of an exemplary door opening/closing mechanism 116 in the load port shown in FIG. 1, in accordance with some embodiments of the present disclosure. FIG. 2B illustrates a corresponding back view of the exemplary door opening/closing mechanism 116 shown in FIG. 2A, in accordance with some embodiments of the present disclosure.

As shown in FIG. 2A and FIG. 2B, the door opening/closing mechanism 116 in this example includes a key plate 230 holding a pair of latch keys 210-1, 210-2 and a pair of vacuum pins 220-1, 220-2, and a pair of rails 240-1, 240-2 supporting movement of the key plate 230, with or without a wafer carrier door, along the Z and −Z directions. The pair of latch keys 210-1, 210-2 and the pair of vacuum pins 220-1, 220-2 are coupled on the front side of the key plate 230, i.e. facing the door 122 of the wafer carrier 120 along the X direction before the door 122 is opened. As shown in FIG. 2B, the door 122 in this example includes a pair of latch key grooves 124 (only one of them is shown in FIG. 2B) and a pair of suction holes 126 (only one of them is shown in FIG. 2B), attached on the door's side facing the key plate 230.

The door opening/closing mechanism 116 may also include a motor (or an engine, not shown in FIG. 2A and FIG. 2B) configured to provide mechanical energy for the key plate 230 to move up or down on the pair of rails 240-1, 240-2 along the Z or −Z direction, and move front or back using a jack (not shown in FIG. 2A and FIG. 2B) along the X or −X direction.

To open the door 122, the key plate 230 can move down along the −Z direction to be aligned with the door 122, then move toward the door 122 along the X direction such that the pair of latch keys 210-1, 210-2 are inserted into the pair of latch key grooves 124, and the pair of vacuum pins 220-1, 220-2 are inserted into the pair of suction holes 126. Each vacuum pin may include a vacuum hole through which a vacuum pressure is applied, when the vacuum pin is inserted into a corresponding suction hole on the door 122. Based on the vacuum pressure, the door 122 is sucked to and held by the key plate 230, such that the key plate 230 can move with the door 122 after the door 122 is unlocked or opened. Before or after the door 122 is pulled against the key plate 230, the pair of latch keys 210-1, 210-2 can be used to rotate the lock on the door 122, e.g. by 90°, to unlock the door 122. After the door 122 is unlocked from the wafer carrier 120 and is held or pulled against the key plate 230, the key plate 230 may move the door 122 away from the wafer carrier 120 along the −X direction, and then move the door 122 up to a corresponding door storage unit along the Z direction for door storage.

To close a door onto the wafer carrier 120, the key plate 230 may move to a door storage unit that stores the door 122 or stores a door having a same model as the door 122, and retrieve the door from the door storage unit. Then the key plate 230 can move down with the retrieved door along the −Z direction to be aligned with the wafer carrier 120, then move toward the wafer carrier 120 along the X direction such that the retrieved door is put onto the wafer carrier 120. The pair of latch keys 210-1, 210-2 can be used to rotate the lock on the retrieved door, e.g. by 90°, to lock the retrieved door onto the wafer carrier 120. Then the vacuum pressure is released through the vacuum pins, such that the retrieved door is separable from the key plate 230. After the retrieved door is locked onto the wafer carrier 120 and is separable from the key plate 230, the key plate 230 may move back away from the wafer carrier 120 along the −X direction.

In some embodiments, the door opening mechanism and the door closing mechanism may be one mechanism, i.e. the door opening/closing mechanism 116 as shown in FIG. 2A and FIG. 2B. In other embodiments, the door opening mechanism may be a separate mechanism from the door closing mechanism.

Figure 3A:
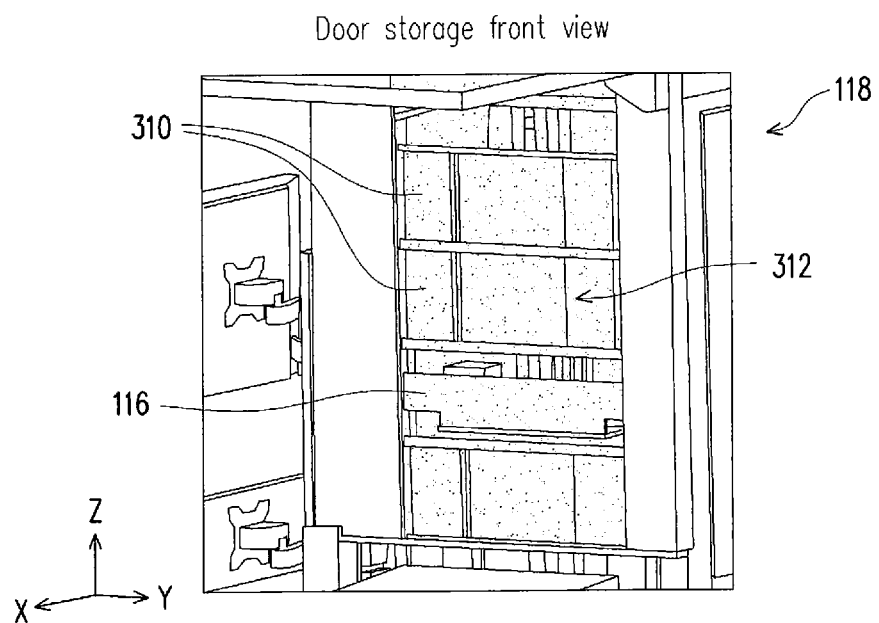
FIG. 3A illustrates a front view of an exemplary door storage space in the load port shown in FIG. 1, in accordance with some embodiments of the present disclosure.
Figure 3B:
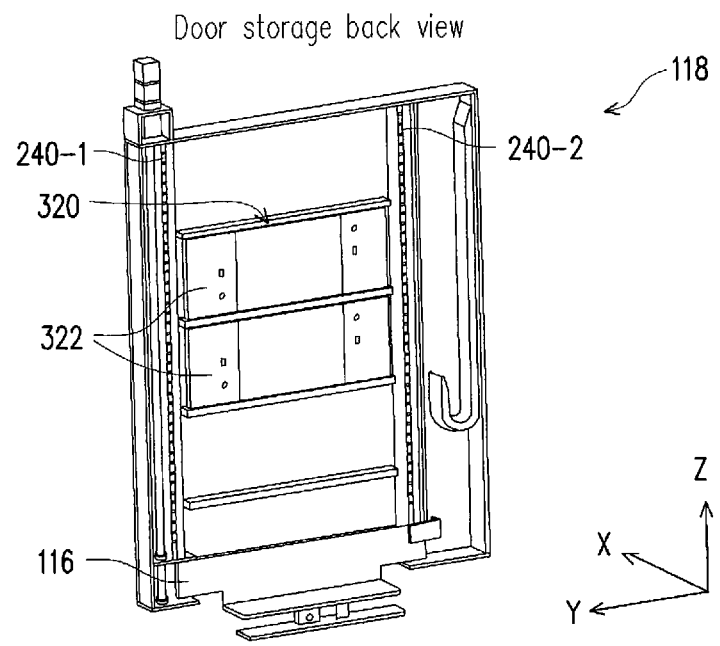
FIG. 3B illustrates a corresponding back view of the exemplary door storage space shown in FIG. 3A, in accordance with some embodiments of the present disclosure.

FIG. 3A illustrates a front view of an exemplary door storage space 118 in the load port shown in FIG. 1, in accordance with some embodiments of the present disclosure. FIG. 3B illustrates a corresponding back view of the exemplary door storage space 118 shown in FIG. 3A, in accordance with some embodiments of the present disclosure.

As shown in FIG. 3A and FIG. 3B, the door storage space 118 in this example includes a plurality of door storage units 310, disposed along the Z direction. It can be understood that according to various embodiments, one or more door storage units may be included in the door storage space 118. Each door storage unit can store a wafer carrier door 322 while the wafer carrier is loaded for wafer processing.

As discussed above, after the door 122 is unlocked from the wafer carrier 120 and is held or pulled against the key plate 230, the key plate 230 may move the door 122 away from the wafer carrier 120 along the −X direction, and then move the door 122 up on the pair of rails 240-1, 240-2 along the Z direction to a corresponding door storage unit, that is not attached with any door, for door storage. To store the door 122, after the key plate 230 moves the door 122 to be aligned with the corresponding door storage unit, the door 122 may be fixed or attached to the corresponding door storage unit based on a door storage mechanism. In one example, the pair of latch keys 210-1, 210-2 may be used to rotate the lock on the door 122, e.g. by 90°, to lock the door 122 onto a corresponding plate 312 at the corresponding door storage unit. In another example, the door 122 may be fixed at the corresponding door storage unit by a separate alignment pin 320. The plate 312 may be a separate plate for each door storage unit as shown in FIG. 3A, or may be a one-piece plate covering the entire door storage space 118. In some embodiments, the plate may be transparent such that a person can see how many wafer carrier doors 322 have been stored in the door storage space 118.

Similarly, to retrieve a door from a door storage unit, the key plate 230 may move to be aligned with the corresponding door storage unit, and unlock the door from the door storage unit, based on the door storage mechanism. In one example, the pair of latch keys 210-1, 210-2 may be used to rotate the lock on the retrieved door, e.g. by 90°, to unlock the retrieved door from a corresponding plate 312 at the corresponding door storage unit. In another example, the retrieved door may be detached from the corresponding door storage unit by releasing the separate alignment pin 320. The retrieved door may be the door 122 or a door having a same model as the door 122. After the retrieved door is unlocked from the corresponding door storage unit and is held or pulled against the key plate 230, the key plate 230 may move the retrieved door down on the pair of rails 240-1, 240-2 along the −Z direction to align the retrieved door with the wafer carrier, for door closing as described above.

In some embodiments, the door storage mechanism may be connected to the door opening/closing mechanism 116 as shown in FIG. 3A and FIG. 3B. In other embodiments, the door storage mechanism may be separate from the door opening/closing mechanism 116.

Figure 4A:
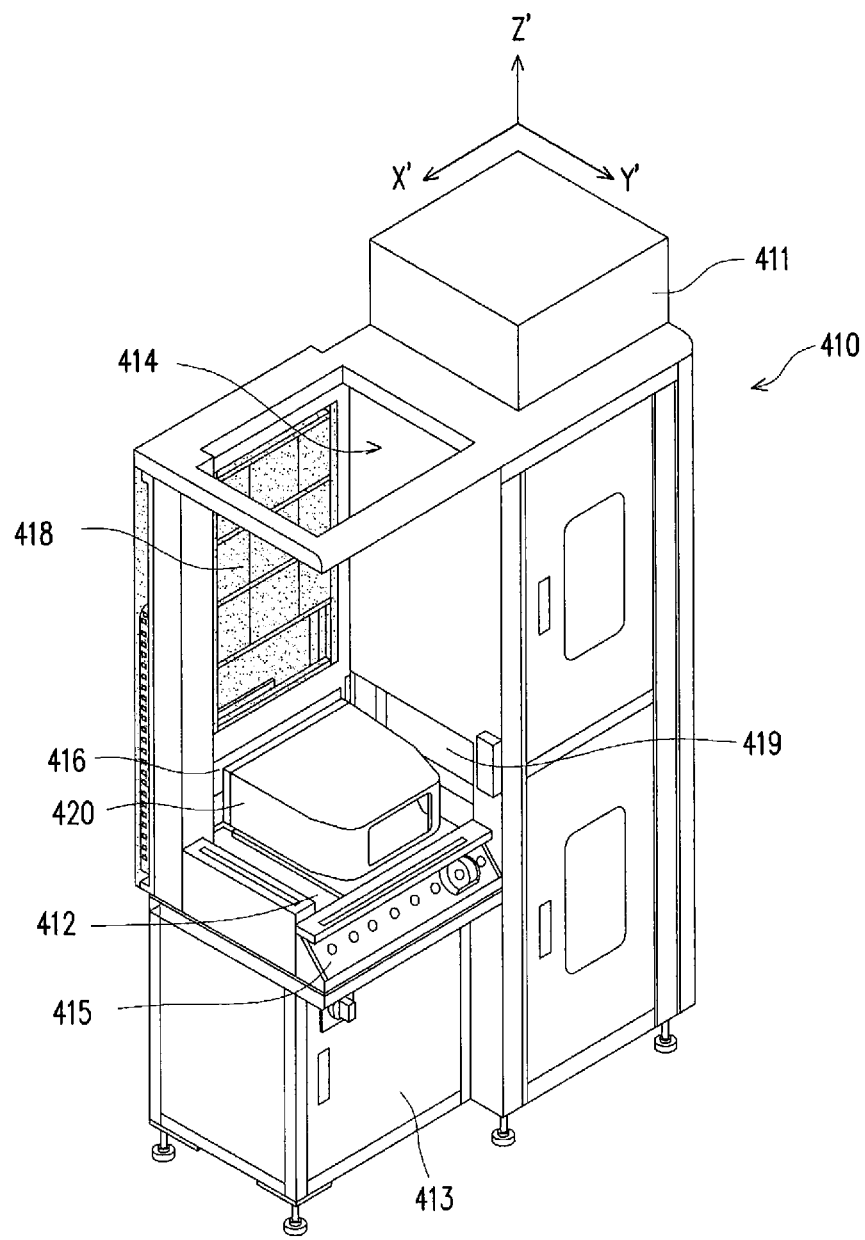
FIG. 4A illustrates a front view of another exemplary load port with door opening, closing and storage mechanisms, in accordance with some embodiments of the present disclosure.
Figure 4B:
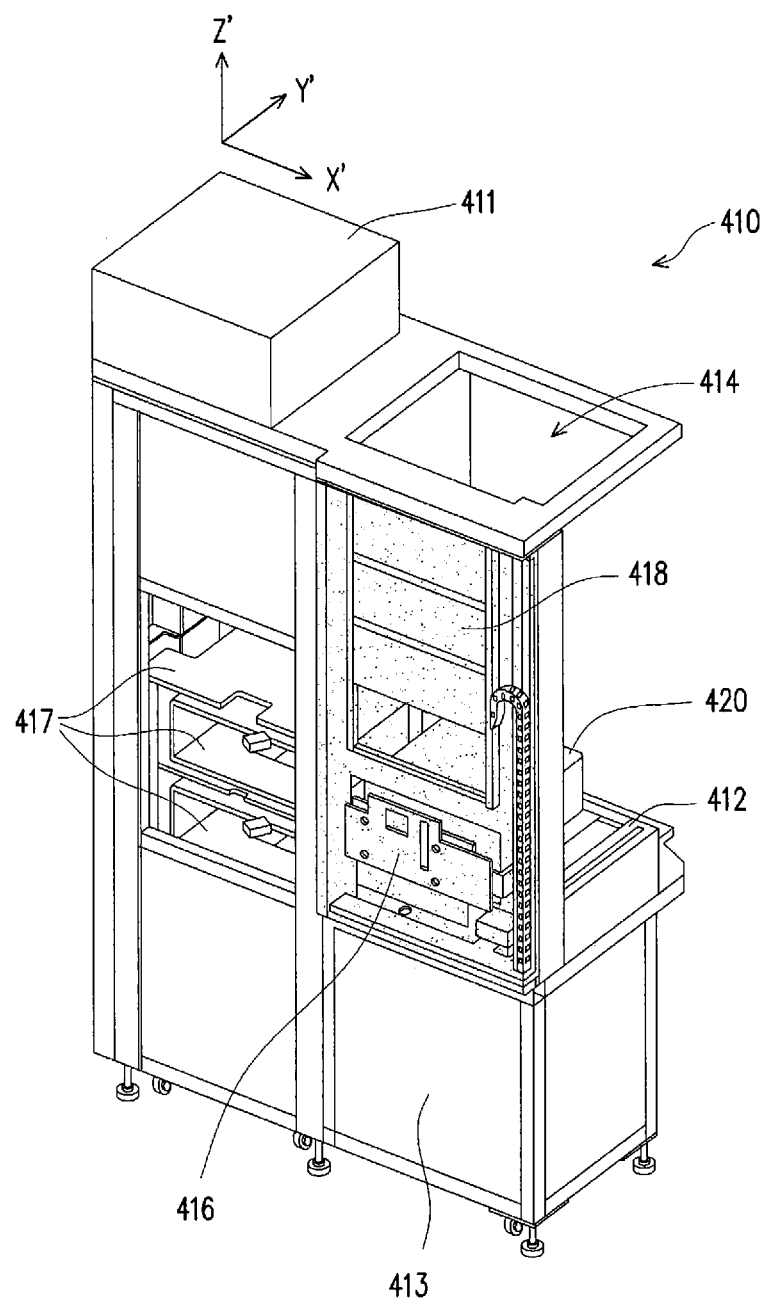
FIG. 4B illustrates a corresponding back view of the exemplary load port shown in FIG. 4A, in accordance with some embodiments of the present disclosure.

FIG. 4A illustrates a front view of another exemplary load port 410 with door opening, closing and storage mechanisms, in accordance with some embodiments of the present disclosure. FIG. 4B illustrates a corresponding back view of the exemplary load port 410 shown in FIG. 4A, in accordance with some embodiments of the present disclosure.

As shown in FIG. 4A and FIG. 4B, the load port 410 includes a housing 411, a table 412, a light shutter 414, a door opening/closing mechanism 416, and a door storage space 418. The load port 410 may be located on a floor of a FAB for handling wafer carriers.

The table 412 may be configured to receive a wafer carrier 420 from a transport tool, e.g. a vehicle of an OHT that is physically coupled to a ceiling of the FAB and is located higher than the table 412. The wafer carrier 420 has a door (not shown in FIG. 4A and FIG. 4B) on the back of the wafer carrier 420, i.e. on the side facing the door storage space 418.

The door opening/closing mechanism 416 in this example is coupled to the housing 411 and located at the left side of the housing 411, i.e. on the side toward the X' direction compared to the housing 411, as shown in FIG. 4A and FIG. 4B. The door opening/closing mechanism 416 may be configured to open the door of the wafer carrier 420, e.g. by a latch key and vacuum pin, and move the door away from the wafer carrier 420 toward the back of the wafer carrier 420 along the −Y' direction as shown in FIG. 4A and FIG. 4B. The door opening/closing mechanism 416 may then hold the door and move it up along the Z' direction to the door storage space 418.

The door storage space 418 in this example is coupled to the housing 411 and located at the left side of the housing 411, i.e. on the side toward the X' direction compared to the housing 411. The door storage 418 may be physically connected to the door opening/closing mechanism 416. The door opening/closing mechanism 416 is movable relative to the door storage space 418, along the Z' and −Z' directions. The door storage space 418 in this example includes four door storage units. It can be understood that a door storage space may include one or more door storage units for storing wafer carrier doors. For example, after moving the door up to one of the door storage units, the door opening/closing mechanism 416 may rotate door pin by the latch key to fix the door into the door storage unit. The door is stored in the door storage unit while the wafer carrier 420 is loaded for wafer processing.

The light shutter 414 in this example is coupled to the housing 411 and located at the left side of the housing 411 and above the table 412. The wafer carrier 420 is transported by a transport tool, e.g. an OHT, from up of the load port 410 along the −Z direction, through the light shutter 414 and down to the table 412. The light shutter 414 can capture light information of a wafer transport path between the light shutter 414 and the table 412. Because any wafer carrier is received by the table 412 through the wafer transport path, if there is any object or obstacle located on the wafer transport path, continuing transporting wafer carriers may cause a collision. As such, a sensor (not shown), e.g. an E84 sensor, that is electrically connected to the light shutter 414 may determine whether there is an obstacle on the wafer transport path based on the light information captured by the light shutter 414 and send a signal to the OHT, to stop OHT from transporting any more wafer carrier onto the table 412, until the wafer transport path is clear and has no obstacle. For example, after an E84 sensor connected to the light shutter 414 determines that there is an obstacle between the light shutter 414 and the table 412, the E84 sensor may inform another sensor, e.g. an E87 sensor, connected to the OHT, about the obstacle to stop OHT from transporting wafer carriers to the table 412. Then, after the light information reflects that obstacle is gone and the wafer transport path is clear, the E84 sensor may inform the E87 sensor with another signal, to ask the OHT to continue transporting wafer carriers to the table 412.

The housing 411 in this example has an input gateway 419 facing the right side of the wafer carrier 420. The table 412 is movable relative to the housing 411. In one embodiment, the load port 410 also includes a controller 413. The controller 413 may control the table 412 to move the wafer carrier 420 through the input gateway 419 and into a buffering space along the −X' direction, i.e. to load the wafer carrier 420 into the buffering space for a processing tool to process at least one wafer in the wafer carrier 420.

A processing tool (not shown in FIG. 4A or FIG. 4B) may be coupled to the load port 410 for retrieving and processing at least one wafer in the wafer carrier 420 whose door has been opened and stored in the door storage space 418. The processing tool may be a manufacturing apparatus, a visual inspection apparatus, an electrical characteristic test apparatus, etc.

In accordance with various embodiments, the controller 413 may be disposed under the table 412 as shown in FIG. 4A and FIG. 4B, or disposed within the housing 411, or disposed at other places of the load port 410. The controller 413 may be electrically or mechanically connected to the table 412 for controlling the table 412. After the processing tool finishes processing the at least one wafer in the wafer carrier 420, the controller 413 may control the table 412 to unload the wafer carrier 420 from the buffering space.

After the wafer carrier 420 is unloaded, the door opening/closing mechanism 416 may be configured to retrieve a door from the door storage space 418. The retrieved door may be the original door of the wafer carrier 420 before the wafer carrier 420 is loaded, or may be another door having a same model as the original door to fit the wafer carrier 420. The door opening/closing mechanism 416 may hold and move down the retrieved door along the −Z' direction from the corresponding storage unit and close the retrieved door onto the wafer carrier 420, e.g. by a latch key and vacuum pin. The OHT may then transport the unloaded wafer carrier 420 to another load port for further processing of the one or more wafers in the wafer carrier 420.

In addition to a simple load port supporting one cassette or one wafer carrier at a time, as described above, the present teaching is also applicable to a multi-cassette load port (MCLP). When the load port 410 is a MCLP, there is a plurality of buffering spaces 417 movably disposed in the housing 411. For wafer carrier loading, the controller 413 may first control the plurality of buffering spaces 417 to move up or down along the Z' or −Z' direction, such that one of the buffering spaces 417 is aligned with the table 412. The controller 413 may then control the table 412 to move the wafer carrier 420 through the input gateway 419 and into an aligned buffering space along the −X' direction, i.e. to load the wafer carrier 420 into the aligned buffering space for a processing tool to process at least one wafer in the wafer carrier 420. The processing tool (not shown in FIG. 4A or FIG. 4B) may be coupled to the load port 410 for retrieving and processing wafers in the wafer carriers (whose doors have been opened and stored in the door storage space 418) that are buffered in the plurality of buffering spaces 417 in the housing 411.

For wafer carrier unloading of the MCLP, after the processing tool finishes processing the at least one wafer in the wafer carrier 420, the controller 413 may control the table 412 to unload the wafer carrier 420 from the aligned buffering space. It can be understood that since there are multiple wafer carriers buffered in the buffering spaces 417 of the MCLP waiting for wafer processing, the previously aligned buffering space may be misaligned with 412. In this case, the controller 413 may first control the buffering spaces to move up or down along the Z' or −Z' direction to realign the previously aligned buffering space with the table 412, before controlling the table 412 to unload the wafer carrier 420 from the realigned buffering space.

The operations of the light shutter 414, the door opening/closing mechanism 416 and the door storage space 418 in the MCLP may be same or similar to what have been described for the simple load port described above.

In accordance with the embodiment shown in FIG. 4A and FIG. 4B, the housing 411 including the plurality of buffering spaces 417 is located at the right side of the wafer carrier 420, from an operator's point of view when the operator is standing in front of the load port 410 and facing the door storage space 418. In this case, the table 412 is configured to move the wafer carrier 420 into a buffering space from left to right, from the operator's point of view.

It can be understood that in some other embodiments, the housing of the load port including buffering spaces may be located at the left side of the wafer carrier, and the table is configured to move the wafer carrier into a buffering space from right to left, from the operator's point of view.

As shown in FIG. 4A and FIG. 4B, the load port 410 further includes a plurality of key-switches 415. Different components of the load port 410, e.g. the controller 413, the door opening/closing mechanism 416, the door storage space 418, etc., may be configured to operate based on a pressed signal generated by any of the key-switches 415.

Figure 5:
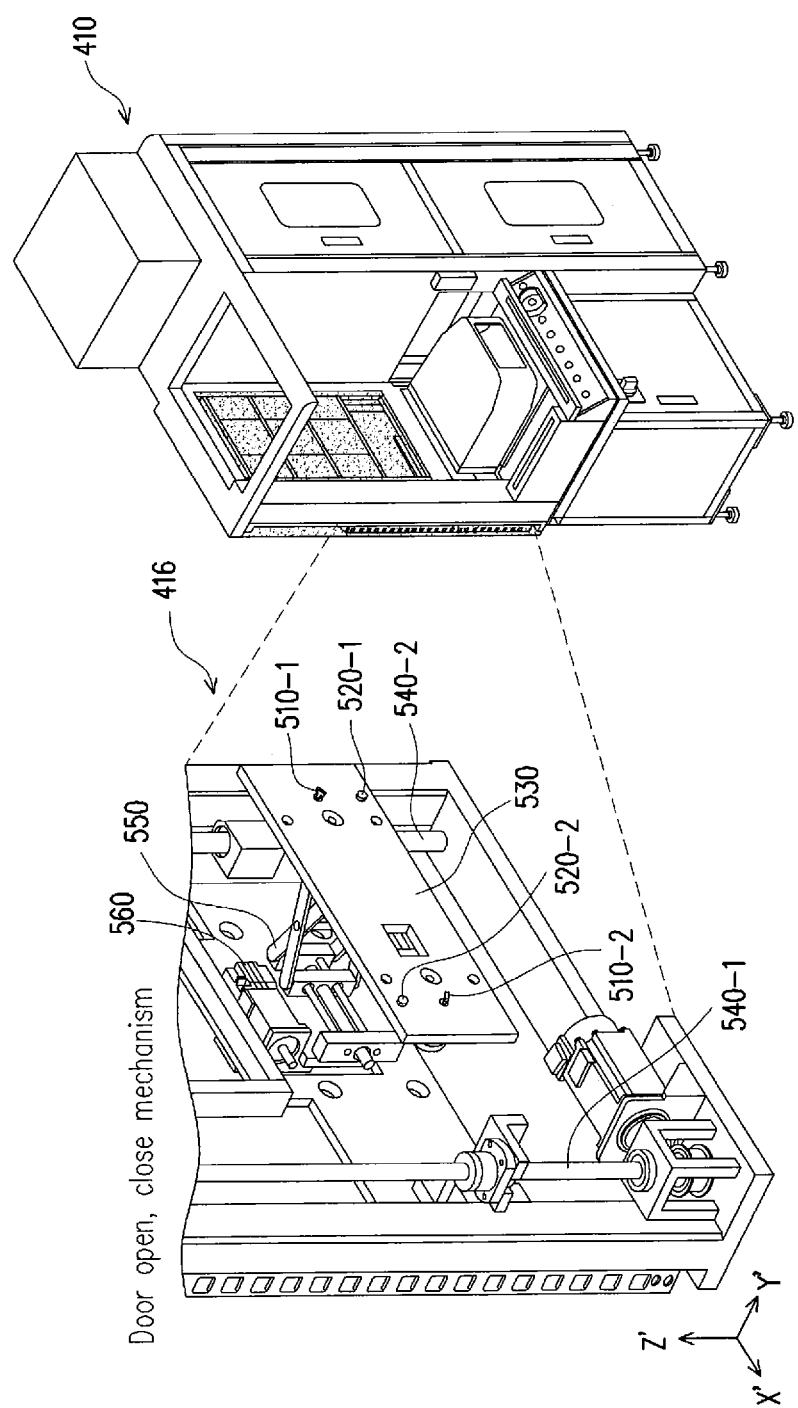
FIG. 5 illustrates an exemplary door opening/closing mechanism in the load port shown in FIG. 4A and FIG. 4B, in accordance with some embodiments of the present disclosure.

FIG. 5 illustrates an exemplary door opening/closing mechanism 416 in the load port 410 shown in FIG. 4A and FIG. 4B, in accordance with some embodiments of the present disclosure. As shown in FIG. 5, the door opening/closing mechanism 416 in this example includes a key plate 530 holding a pair of latch keys 510-1, 510-2 and a pair of vacuum pins 520-1, 520-2, and a pair of rails 540-1, 540-2 supporting movement of the key plate 530, with or without a wafer carrier door, along the Z' and −Z' directions. The pair of latch keys 510-1, 510-2 and the pair of vacuum pins 520-1, 520-2 are coupled on the front side of the key plate 530, i.e. facing the door of the wafer carrier 420 along the Y' direction before the door is opened. The door in this example may include a pair of latch key grooves (not shown in FIG. 5) and a pair of suction holes (not shown in FIG. 5), attached on the door's side facing the key plate 530.

The door opening/closing mechanism 416 may also include a motor (or an engine) 560 configured to provide mechanical energy for the key plate 530 to move up or down on the pair of rails 540-1, 540-2 along the Z' or −Z' direction, and move front or back using a jack 550 along the Y' or −Y' direction.

To open the wafer carrier door, the key plate 530 can move down along the −Z' direction to be aligned with the door, then move toward the door along the Y' direction such that the pair of latch keys 510-1, 510-2 are inserted into the pair of latch key grooves, and the pair of vacuum pins 520-1, 520-2 are inserted into the pair of suction holes. Each vacuum pin may include a vacuum hole through which a vacuum pressure is applied, when the vacuum pin is inserted into a corresponding suction hole on the door. Based on the vacuum pressure, the door is sucked to and held by the key plate 530, such that the key plate 530 can move with the door after the door is unlocked or opened. Before or after the door is pulled against the key plate 530, the pair of latch keys 510-1, 510-2 can be used to rotate the lock on the door, e.g. by 90°, to unlock the door. After the door is unlocked from the wafer carrier 420 and is held or pulled against the key plate 530, the key plate 530 may move the door away from the wafer carrier 420 along the −Y' direction, and then move the door up to a corresponding door storage unit along the Z' direction for door storage.

To close a door onto the wafer carrier 420, the key plate 530 may move to a door storage unit that stores the door or stores a door having a same model as the door, and retrieve the door from the door storage unit. Then the key plate 530 can move down with the retrieved door along the −Z' direction to be aligned with the wafer carrier 420, then move toward the wafer carrier 420 along the Y' direction such that the retrieved door is put onto the wafer carrier 420. The pair of latch keys 510-1, 510-2 can be used to rotate the lock on the retrieved door, e.g. by 90°, to lock the retrieved door onto the wafer carrier 420. Then the vacuum pressure is released through the vacuum pins, such that the retrieved door is separable from the key plate 530. After the retrieved door is locked onto the wafer carrier 420 and is separable from the key plate 530, the key plate 530 may move back away from the wafer carrier 420 along the −Y' direction.

In some embodiments, the door opening mechanism and the door closing mechanism may be one mechanism, i.e. the door opening/closing mechanism 416 as shown in FIG. 5. In other embodiments, the door opening mechanism may be a separate mechanism from the door closing mechanism.

Figure 6:
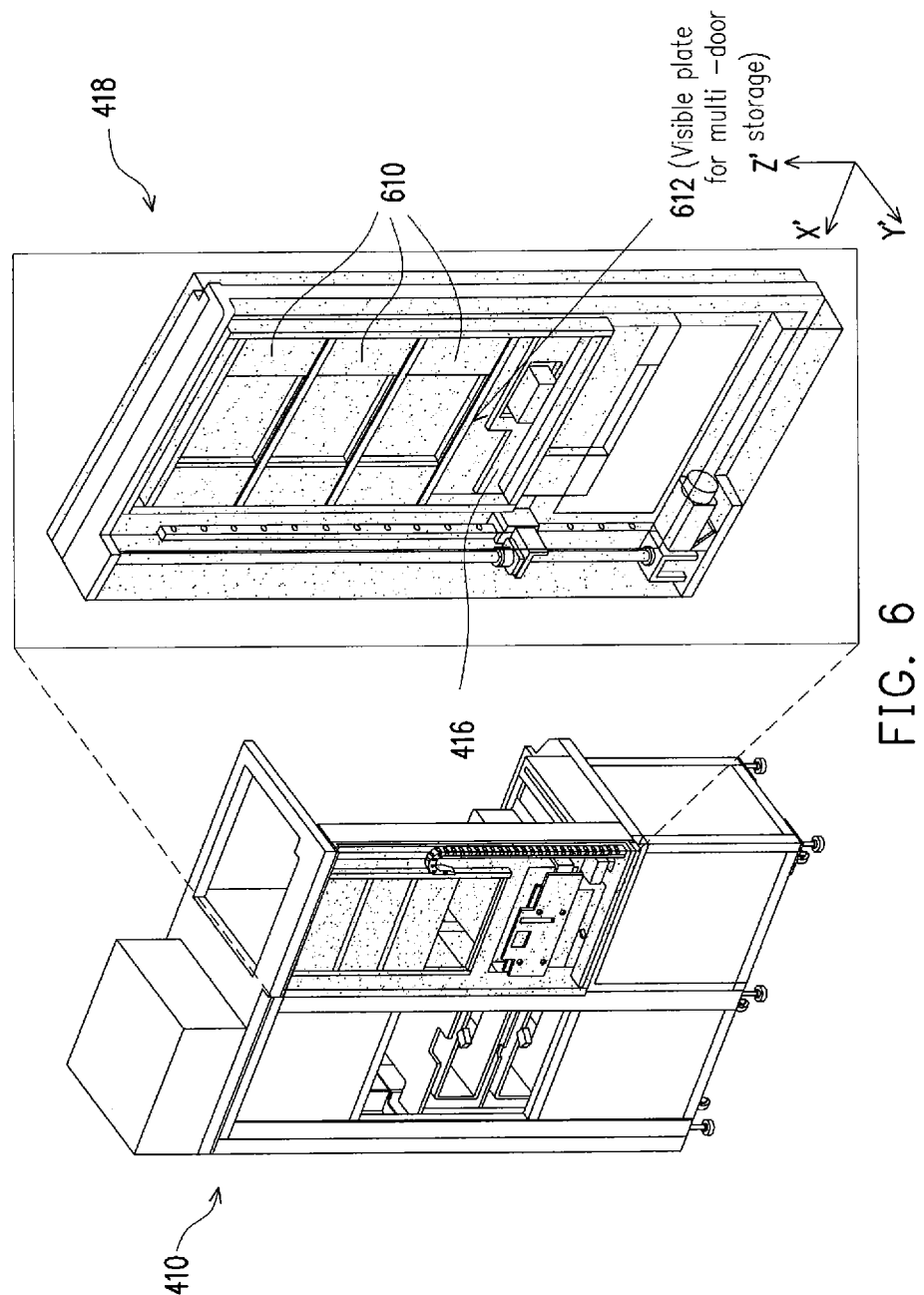
FIG. 6 illustrates an exemplary door storage space in the load port shown in FIG. 4A and FIG. 4B, in accordance with some embodiments of the present disclosure.

FIG. 6 illustrates an exemplary door storage space 418 in the load port 410 shown in FIG. 4A and FIG. 4B, in accordance with some embodiments of the present disclosure. As shown in FIG. 6, the door storage space 418 in this example includes a plurality of door storage units 610, disposed along the Z' direction. It can be understood that according to various embodiments, one or more door storage units may be included in the door storage space 418. Each door storage unit can store a wafer carrier door while the wafer carrier is loaded for wafer processing.

As discussed above, after the door is unlocked from the wafer carrier 420 and is held or pulled against the key plate 530, the key plate 530 may move the door away from the wafer carrier 420 along the −Y' direction, and then move the door up on the pair of rails 540-1, 540-2 along the Z' direction to a corresponding door storage unit, that is not attached with any door, for door storage. To store the door, after the key plate 530 moves the door to be aligned with the corresponding door storage unit, the door may be fixed or attached to the corresponding door storage unit based on a door storage mechanism. In one example, the pair of latch keys 510-1, 510-2 may be used to rotate the lock on the door, e.g. by 90°, to lock the door onto a corresponding plate 612 at the corresponding door storage unit. In another example, the door may be fixed at the corresponding door storage unit by a separate alignment pin (not shown in FIG. 6). The plate 612 may be a one-piece plate covering the entire door storage space 418 as shown in FIG. 6 or may be a separate plate for each door storage unit. As shown in FIG. 6, the plate 612 may be transparent such that a person can see how many wafer carrier doors have been stored in the door storage space 418.

Similarly, to retrieve a door from a door storage unit, the key plate 530 may move to be aligned with the corresponding door storage unit, and unlock the door from the door storage unit, based on the door storage mechanism. In one example, the pair of latch keys 510-1, 510-2 may be used to rotate the lock on the retrieved door, e.g. by 90°, to unlock the retrieved door from a corresponding plate 612 at the corresponding door storage unit. In another example, the retrieved door may be detached from the corresponding door storage unit by releasing the separate alignment pin. The retrieved door may be the original door or a door having a same model as the original door. After the retrieved door is unlocked from the corresponding door storage unit and is held or pulled against the key plate 530, the key plate 530 may move the retrieved door down on the pair of rails 540-1, 540-2 along the −Z' direction to align the retrieved door with the wafer carrier, for door closing as described above.

In some embodiments, the door storage mechanism may be a same mechanism as the door opening/closing mechanism 416 as shown in FIG. 6. In other embodiments, the door storage mechanism may be a different mechanism from the door opening/closing mechanism 416.

Figure 7:
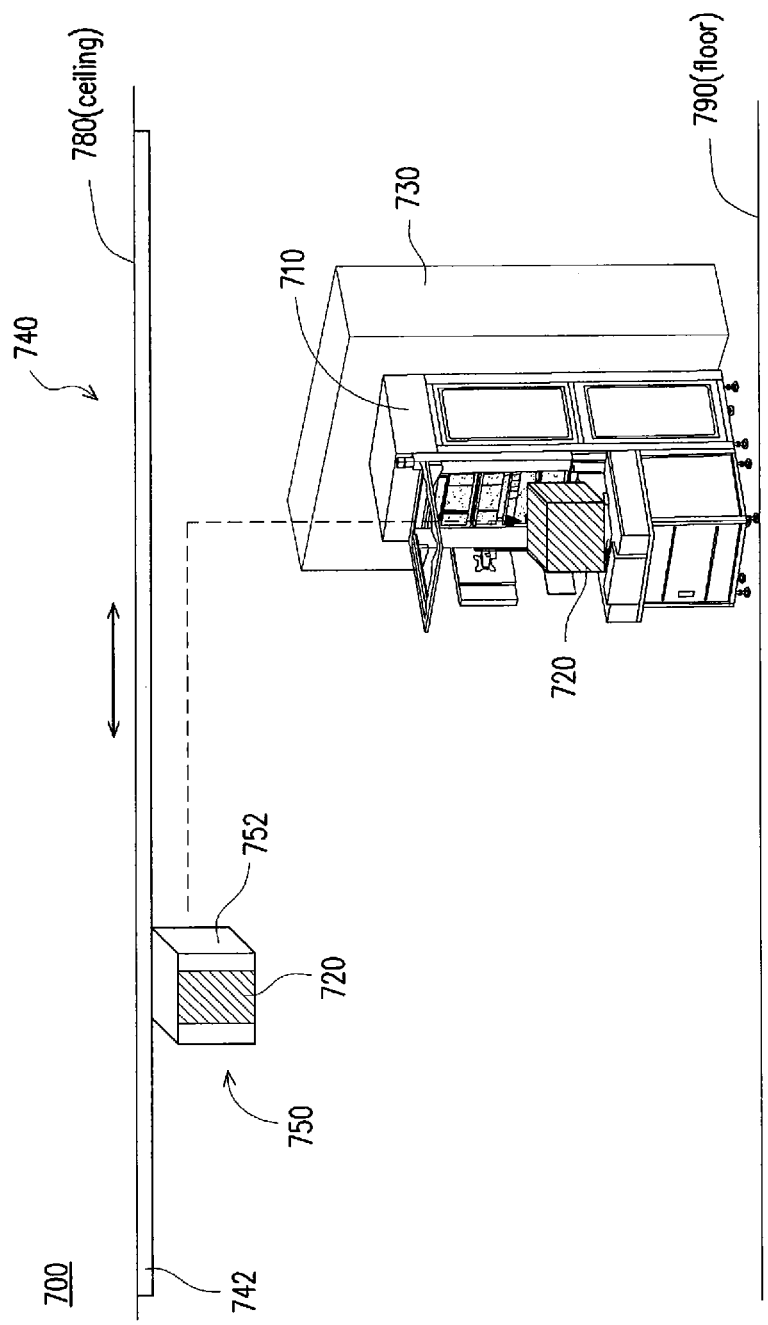
FIG. 7 illustrates a portion of a semiconductor FAB including a wafer transport tool and a load port, in accordance with some embodiments of the present disclosure.

FIG. 7 illustrates a portion of a semiconductor FAB 700 including a wafer transport tool 740 and a load port 710, in accordance with some embodiments of the present disclosure. The portion of the FAB 700 shown in FIG. 7 may be a schematic perspective diagram of an automatic material handling system (AMHS). As shown in FIG. 7, the AMHS includes a wafer transport tool 740, e.g. an OHT system, and a load port 710, which may be any load port as disclosed above in accordance with FIGS. 1-6, e.g. an MCLP.

In one example, the OHT system 740 includes a network of stationary tracks or rails 742 operable to guide the movement of one or more wheeled OHT vehicles 750 supported and suspended from the rails 742. In some embodiments, the rails 742 are monorails that are mounted to and suspended from the ceiling 780 and/or walls of the FAB. Rails 742 have any suitable cross-sectional configuration as will be appreciated by those in the art so long as the OHT vehicle 750 are appropriately supported from the rail 742 for rolling motion.

An OHT vehicle 750 is operable to transport a wafer carrier 720 through the FAB 700 for intra-bay or inter-bay movement. The OHT vehicle 750 is configured and structured to hold a wafer carrier 720 housing a plurality of wafers and transport the wafer carrier 720 in a generally horizontal or lateral direction from one location to another within the FAB 700.

The OHT vehicle 750 is configured and operable to pick up, raise/lower, hold, articulate, and release a wafer carrier 720. In one embodiment, the OHT vehicle 750 includes a motor-driven or pneumatic hoisting mechanism 752 generally comprised of gripper assembly including one or more retractable and extendable gripper arms having a gripper on the end thereof configured for locking onto a mating hook or flange on the wafer carrier 720. The hoisting mechanism 752 is operable to vertically raise and lower the gripper and attached wafer carrier 720.

As shown in FIG. 7, the OHT vehicle 750 can hold the wafer carrier 720, transport the wafer carrier 720 along the rail 742, and release the wafer carrier 720 onto the table of the load port 710. The load port 710 can automatically open and store the door of the wafer carrier 720 and load the wafer carrier 720 for a processing tool 730 to process at least one wafer in the wafer carrier 720, in a manner similar to what have been described in FIGS. 1-6. In this example, the processing tool 730 is coupled to the load port 710. Both the load port 710 and the processing tool 730 are located on the floor 790 of the FAB 700.

In some embodiments, there are multiple processing tools in the FAB 700, and each processing tool is coupled to a corresponding load port that is a load port as disclosed above in accordance with FIGS. 1-6. In this situation, after the at least one wafer in the wafer carrier 720 is processed and the wafer carrier 720 is unloaded by the load port 710, the OHT vehicle 750 can pick up the wafer carrier 720 from the load port 710 and transport the wafer carrier 720 to a next load port for additional wafer processing at the processing tool coupled to the next load port.

FIG. 8 is a flow chart illustrating an exemplary method 800 for handling wafer carriers, in accordance with some embodiments of the present disclosure. As shown in FIG. 8, a wafer carrier having a door and operable to hold a plurality of wafers, is received at 802. The door of the wafer carrier is opened at 804. The door is stored at 806 in a storage space of a device located on a floor of a FAB. As discussed above, the device may be a load port, e.g. an MCLP, coupled to a processing tool. At 808, the wafer carrier is loaded by the device for the processing tool to process at least one wafer in the wafer carrier.

Figure 9A:
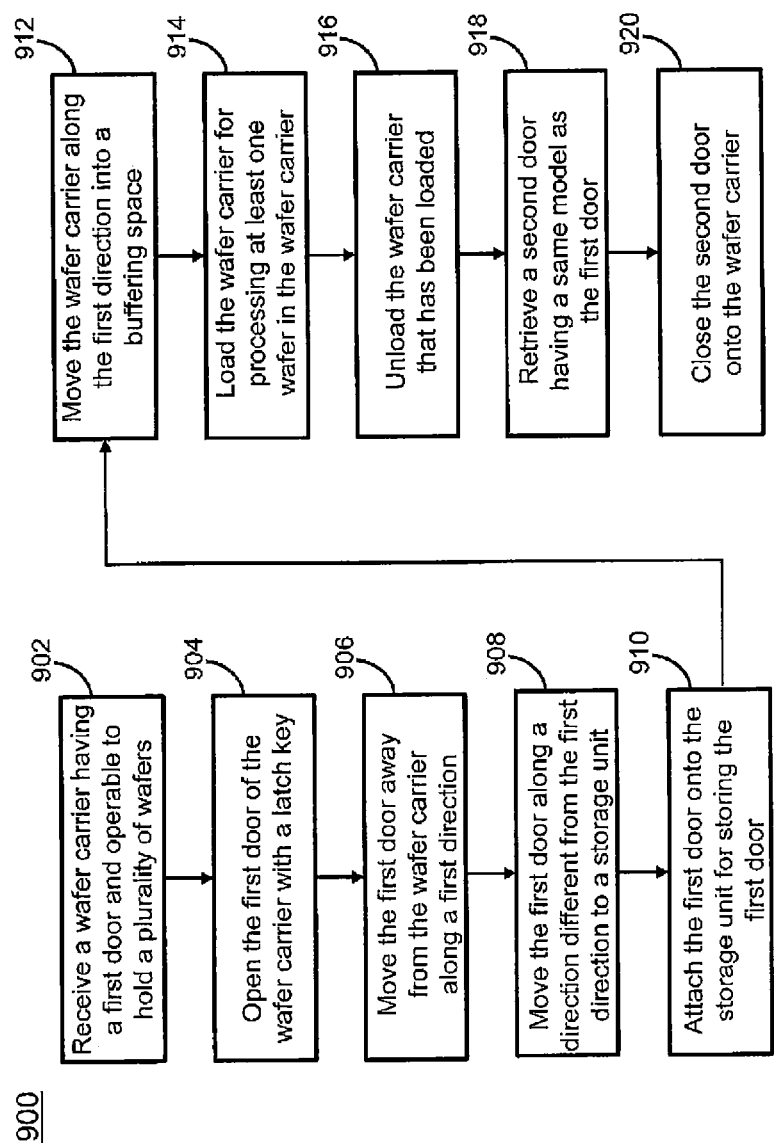
FIG. 9A is a flow chart illustrating another exemplary method for handling wafer carriers, in accordance with some embodiments of the present disclosure.

FIG. 9A is a flow chart illustrating another exemplary method 900 for handling wafer carriers, in accordance with some embodiments of the present disclosure. As shown in FIG. 9A, a wafer carrier having a first door and operable to hold a plurality of wafers, is received at 902. The first door of the wafer carrier is opened with a latch key at 904. The first door is moved away at 906 from the wafer carrier along a first direction. The first door is moved at 908 along a direction different from the first direction to a storage unit. The first door is attached at 910 onto the storage unit in a device for storing the first door. As discussed above, the device may be a load port, e.g. an MCLP, located on a floor of a FAB.

At 912, the wafer carrier is moved along the first direction into a buffering space. The wafer carrier is loaded at 914 for processing at least one wafer in the wafer carrier. After being loaded, the wafer carrier is unloaded at 916. A second door having a same model as the first door is retrieved at 918. The second door is closed at 920 onto the wafer carrier.

Figure 9B:
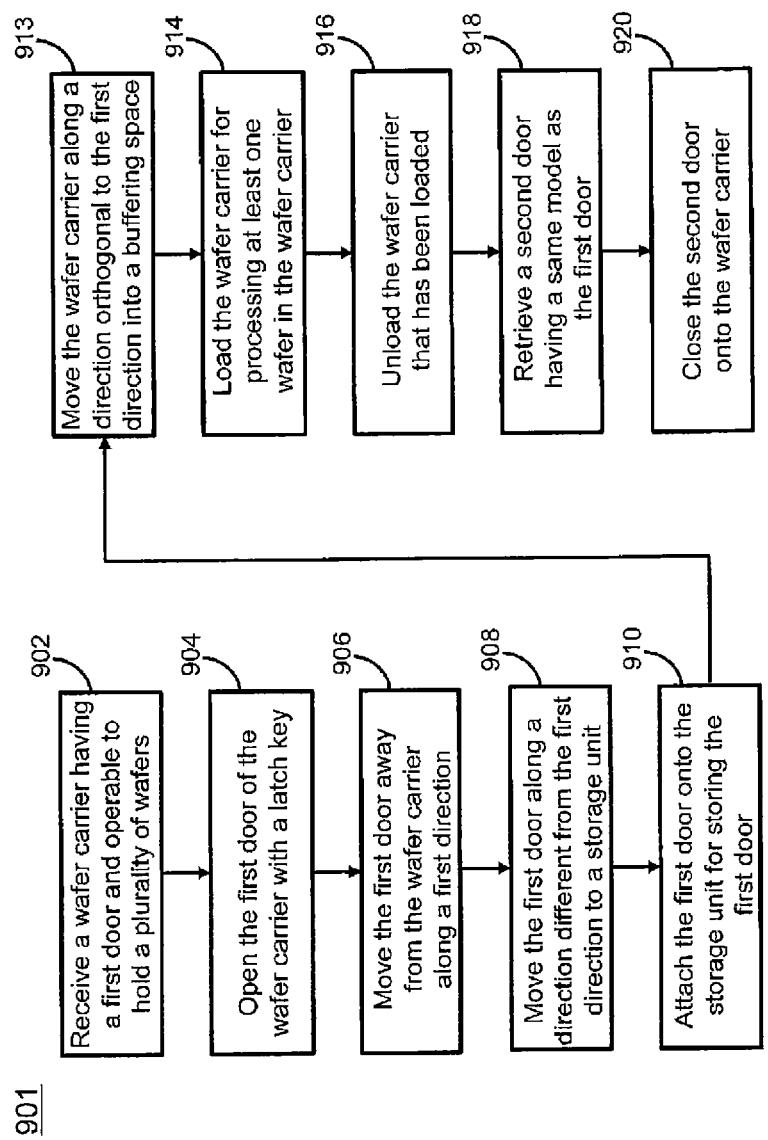
FIG. 9B is a flow chart illustrating yet another exemplary method for handling wafer carriers, in accordance with some embodiments of the present disclosure.

FIG. 9B is a flow chart illustrating yet another exemplary method 901 for handling wafer carriers, in accordance with some embodiments of the present disclosure. The exemplary method 901 is similar to the exemplary method 900, except that the step 912 is replaced by the step 913, where the wafer carrier is moved along a direction orthogonal to the first direction into a buffering space. As discussed above, an operator may stand on the front side of a wafer carrier on the table of the load port as disclosed herein, while the door of the wafer carrier is located on the back side of the wafer carrier, although the disclosed load port can automatically operate the wafer carrier without a human operator. In this scenario, from the operator's point of view, the table may be configured to move the wafer carrier into a buffering space of the load port, from front to back e.g. as in step 912, from left to right or from right to left e.g. as in step 913, according to various embodiments.

It can be understood that the order of the steps shown in each of FIG. 8, FIG. 9A, and FIG. 9B may be changed according to different embodiments of the present disclosure.

Figure 10:
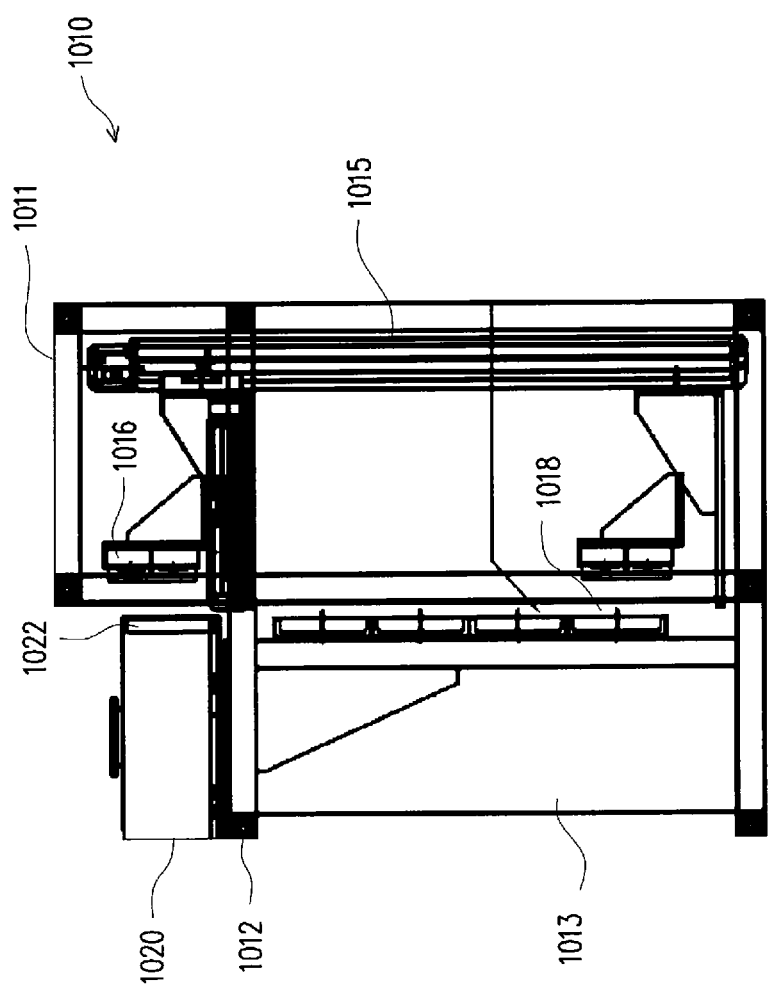
FIG. 10 illustrates a side view of an exemplary sky port with door opening, closing and storage mechanisms, in accordance with some embodiments of the present disclosure.

FIG. 10 illustrates a side view of an exemplary sky port 1010 with door opening, closing and storage mechanisms, in accordance with some embodiments of the present disclosure. As shown in FIG. 10, the sky port 1010 includes a housing 1011, a table 1012, a door opening/closing mechanism 1016, and a door storage space 1018. The sky port 1010 may be located on a ceiling of a FAB to save floor area of the FAB.

The table 1012 may be configured to receive a wafer carrier 1020 from a transport tool, e.g. a vehicle of an OHT that is physically coupled to the ceiling of the FAB and is located higher than the table 1012. The wafer carrier 1020 has a door 1022 on the back of the wafer carrier 1020, i.e. on the side facing the housing 1011.

The door opening/closing mechanism 1016 in this example is located inside the housing 1011 and located at the front side of the housing 1011, i.e. at the side facing the wafer carrier 1020. The door opening/closing mechanism 1016 may be configured to open the door 1022 of the wafer carrier 1020, e.g. by a latch key and a vacuum pin, and move the door 1022 away from the wafer carrier 1020 toward the back of the wafer carrier 1020 along the −X direction as shown in FIG. 10. The door opening/closing mechanism 1016 may then hold the door 1022 and move it down along the −Z direction to the door storage 1018.

The door storage 1018 in this example is coupled to the housing 1011 and located at the front side of the housing 1011, i.e. at the side facing the wafer carrier 1020 and below the table 1012. It can be understood that the door storage 1018 may be located at other places of the sky port 1010, e.g. on the other side of the housing 1011 and/or above the table 1012. The door storage 1018 may be physically connected to the door opening/closing mechanism 1016. The door opening/closing mechanism 1016 is movable relative to the door storage space 1018, along the Z and −Z directions. The door storage 1018 in this example includes four door storage units. It can be understood that a door storage space may include one or more door storage units for storing wafer carrier doors. For example, after moving the door 1022 down to one of the door storage units, the door opening/closing mechanism 1016 may rotate door pin by the latch key to fix the door 1022 into the door storage unit. The door 1022 is stored in the door storage unit while the wafer carrier 1020 is loaded by a load port for wafer processing.

In some embodiments, the sky port 1010 may also include a light shutter (not shown in FIG. 10). The light shutter may be coupled to the housing 1011 and located at the front side of the housing 1011 and above the table 1012, such that the wafer carrier 1020 is transported by a transport tool, e.g. an OHT, from up of the sky port 1010 along the −Z direction, through the light shutter and down to the table 1012. The light shutter can capture light information of a wafer transport path between the light shutter and the table 1012. Because any wafer carrier is received by the table 1012 through the wafer transport path, if there is any object or obstacle located on the wafer transport path, continuing transporting wafer carriers may cause a collision. As such, a sensor (not shown), e.g. an E84 sensor, that is electrically connected to the light shutter may determine whether there is an obstacle on the wafer transport path based on the light information captured by the light shutter and send a signal to the OHT, to stop OHT from transporting any more wafer carrier onto the table 1012, until the wafer transport path is clear and has no obstacle. For example, after an E84 sensor connected to the light shutter determines that there is an obstacle between the light shutter and the table 1012, the E84 sensor may inform another sensor, e.g. an E87 sensor, connected to the OHT, about the obstacle to stop OHT from transporting wafer carriers to the table 1012. Then, after the light information reflects that obstacle is gone and the wafer transport path is clear, the E84 sensor may inform the E87 sensor with another signal, to ask the OHT to continue transporting wafer carriers to the table 1012.

In one embodiment, the sky port 1010 also includes a controller 1013. The controller 1013 may control the door opening/closing mechanism 1016 to move, via a moving mechanism 1015, the door 1022 along the −Z direction to an empty door storage unit in the door storage space 1018. In accordance with various embodiments, the controller 1013 may be disposed under the table 1012 as shown in FIG. 10, or disposed within the housing 1011, or disposed at other places of the sky port 1010. The controller 1013 may be electrically or mechanically connected to the door opening/closing mechanism 1016 and the door storage space 1018.

After the door 1022 is opened and stored at the sky port 1010, the wafer carrier 1020 may be transported, e.g. by the OHT, to a load port. The load port may load the wafer carrier 1020 for a processing tool to process at least one wafer in the wafer carrier 1020. The processing tool may be a manufacturing apparatus, a visual inspection apparatus, an electrical characteristic test apparatus, etc.

After the wafer processing, the load port may unload the wafer carrier 1020; and the wafer carrier 1020 may be transported back to the sky port 1010. Then, the door opening/closing mechanism 1016 may be configured to retrieve a door from the door storage space 1018. The retrieved door may be the original door 1022 of the wafer carrier 1020 before the wafer carrier 1020 is loaded, or may be another door having a same model as the original door 1022 to fit the wafer carrier 1020. The door opening/closing mechanism 1016 may hold and move, via the moving mechanism 1015, up the retrieved door along the Z direction from the corresponding storage unit and close the retrieved door onto the wafer carrier 1020, e.g. by a latch key and a vacuum pin. In one embodiment, the moving mechanism 1015 may be part of the door opening/closing mechanism 1016 or separate but connected to the door opening/closing mechanism 1016. The OHT may transport the wafer carrier 1020 having the door 1022 closed back on it to another load port for further processing of the one or more wafers in the wafer carrier 1020.

In one embodiment, the sky port 1010 can serve several load ports at the same time. In this case, after the sky port 1010 opens the door 1022, the wafer carrier 1020 is transported among the several load ports for wafer processing before being transported back to the sky port 1010 for door closing.

In another embodiment, one sky port serves one load port for one type of wafer processing. In this case, after the sky port 1010 opens the door 1022 and the wafer carrier 1020 is loaded and unloaded at the corresponding load port, the wafer carrier 1020 is transported back to the sky port 1010 for door closing. To perform another wafer processing on the wafers in the wafer carrier 1020, the wafer carrier 1020 will be transported to a second sky port for door opening, before being transported to a corresponding second load port for loading and processing.

In addition to serve a simple load port supporting one cassette or one wafer carrier at a time, the present teaching is also applicable to a multi-cassette load port (MCLP). When the sky port 1010 serves an MCLP, the controller 1013 may determine which door corresponds to which wafer carrier loaded on the MCLP. As such, when the sky port 1010 receives back the wafer carrier 1020 from the MCLP, the controller 1013 can determine where the corresponding door 1022 or where a matching door having a same model as the door 1022 is stored. The controller 1013 may then control the door opening/closing mechanism 1016 to move, via the moving mechanism 1015, the door 1022 or the matching door up along the Z direction from the door storage unit in the door storage space 1018 for door closing.

The door opening/closing mechanism 1016 in the sky port 1010 may be the same as the door opening/closing mechanism 116 shown in FIG. 2A and FIG. 2B, in accordance with some embodiments of the present disclosure. The door storage space 1018 in the sky port 1010 may be the same as the door storage space 118 as shown in FIG. 3A and FIG. 3B, in accordance with some embodiments of the present disclosure.

Figure 11:
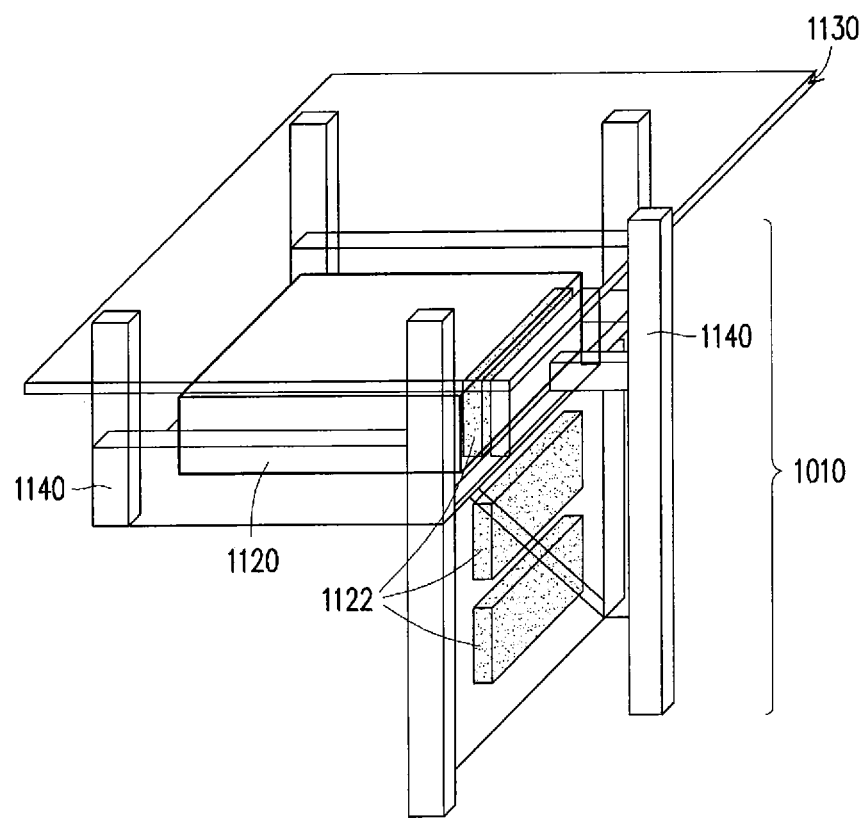
FIG. 11 illustrates an exemplary sky port held on a ceiling of a semiconductor FAB, in accordance with some embodiments of the present disclosure.

FIG. 11 illustrates an exemplary sky port 1010 held on a ceiling 1130 of a semiconductor FAB, in accordance with some embodiments of the present disclosure. As shown in FIG. 11, the sky port 1010 is held onto the ceiling 1130 of a FAB, by one or more connecting poles 1140. The poles 1140 can physically connect the sky port 1010 to the ceiling 1130. In some embodiments, the poles 1140 can be treated as part of the sky port 1010. It can be understood that other holding mechanisms than the poles 1140 can be used to hold the sky port 1010 onto the ceiling 1130.

As discussed above, while the sky port 1010 is held on the ceiling 1130, it can automatically open, close, and store wafer carrier doors 1122. Because a wafer carrier 1120 is transported to and from the sky port 1010 by an OHT, that is also held on the ceiling 1130, the floor area of the FAB can be saved. In addition, the moving distance, in terms of vertical distance, between the OHT and the sky port 1010 is small as they are both coupled to the ceiling 1130. This can improve production quality and operation safety. In one embodiment, the sky port 1010 can be installed above or right above a corresponding load port, such that spare space in the FAB can be utilized while wafer carrier transportation distance is minimized between devices in the FAB.

Figure 12A:
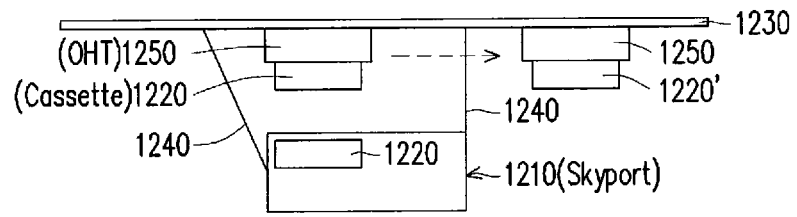
FIG. 12A illustrates a portion of an exemplary Automated Material Handling System (AMHS), in accordance with some embodiments of the present disclosure.
Figure 12B:
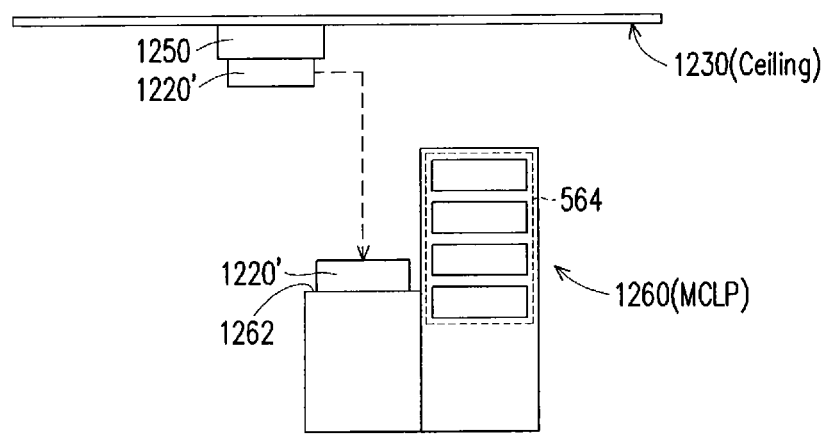
FIG. 12B illustrates another portion of the exemplary AMHS shown in FIG. 12A, in accordance with some embodiments of the present disclosure.

FIG. 12A illustrates a portion of an exemplary Automated Material Handling System (AMHS), in accordance with some embodiments of the present disclosure. FIG. 12B illustrates another portion of the exemplary AMHS shown in FIG. 12A, in accordance with some embodiments of the present disclosure. As shown in FIG. 12A and FIG. 12B, the OHT 1250 may be used to transport a wafer carrier 1220 on the ceiling 1230 of a FAB. To load the wafer carrier 1220 for wafer processing, the OHT first transports the wafer carrier 1220 to a sky port 1210, that is physically coupled to the ceiling 1230 by one or more holding mechanisms 1240, for door opening and storing. The sky port 1210 may automatically open and store a door of the wafer carrier 1220, as discussed above. Then the opened wafer carrier 1220', whose door has been opened and stored at the sky port 1210, is picked up by the OHT 1250 and transported to a load port 1260, e.g. an MCLP. The load port 1260 in this example includes a table 1262 for receiving the opened wafer carrier 1220', and a plurality of buffering spaces 1264 for loading and unloading multiple wafer carriers at the same time.

Figure 13:
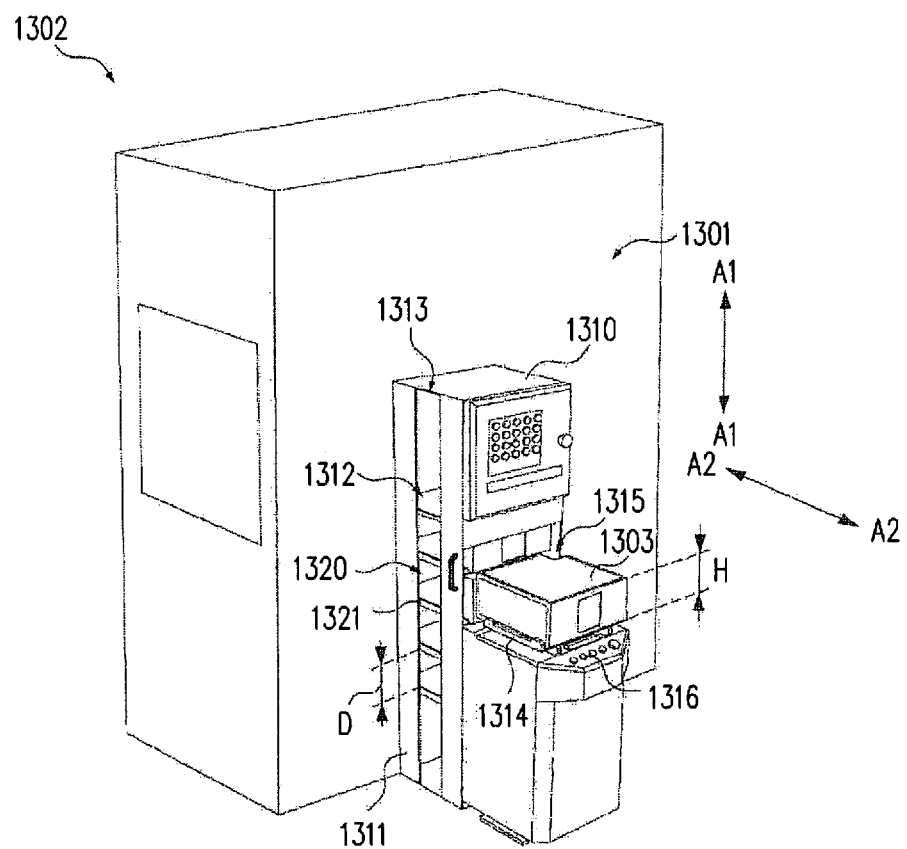
FIG. 13 illustrates a perspective view of an exemplary load port for a processing tool, in accordance with some embodiments of the present disclosure.

FIG. 13 illustrates a perspective view of an exemplary load port 1301 for a processing tool 1302, in accordance with some embodiments of the present disclosure. As shown in FIG. 13, the load port 1301 includes a housing 1310, a carrier 1312, an input table 1314, and a plurality of key switches 1316. The carrier 1312 has a plurality of buffering spaces 1320. The carrier 1312 is movable relative to the processing tool 1302 that is coupled to the load port 1301. The input table 1314 is configured to receive at least one wafer carrier 1303, e.g. from an OHT, whose door has been opened and stored as discussed above.

In one embodiment, the carrier 1312 includes a plurality of supporting plates 1321, and the buffering spaces 1320 are respectively defined over the supporting plates 1321. The carrier 1312 is movable relative to the processing tool 1302 along a first direction A1. The supporting plates 1321 are arranged along the first direction A1. Any two adjacent supporting plates 1321 are separated by a distance D along the first direction A1. The input table 1314 is movable relative to the supporting plates 1321 along a second direction A2 different from the first direction A1. A height H of the wafer carrier 1303 is smaller than the distance D, so as to be received in the space between any two adjacent supporting plates 121.

As shown in FIG. 13, the housing 1310 has a doorway 1313 to the carrier 1312. The load port 1301 further includes a door 1311 pivotally connected to the housing 1310 and capable of selectively opening and closing the doorway 1313. When the load port 1301 malfunctions, the wafer carrier 1303 received in the carrier can be taken out via the doorway 1313 by opening the door 1311.

The housing 1310 has an input gateway 1315 facing the input table 1314. The carrier 1312 is movably disposed in the housing 1310, and the input table 1314 is movable into and out of the aligned buffering space 1320 via the input gateway 1315.

In one embodiment, the load port 1301 also includes a controller. For wafer carrier loading, the controller may first control the plurality of buffering spaces to move up or down along the A1 direction, such that one of the buffering spaces is aligned with the table 1314. The controller may then control the table 1314 to move the wafer carrier 1303 through the input gateway 1315 and into an aligned buffering space along the A2 direction, i.e. to load the wafer carrier 1303 into the aligned buffering space for the processing tool 1302 to process at least one wafer in the wafer carrier 1303. The processing tool 1302 may be coupled to the load port 1301 for retrieving and processing wafers in the wafer carriers (whose doors have been opened and stored in the door storage space 1018) that are buffered in the plurality of buffering spaces in the housing 1310. The processing tool may be a manufacturing apparatus, a visual inspection apparatus, an electrical characteristic test apparatus, etc.

For wafer carrier unloading of the MCLP 1301, after the processing tool 1301 finishes processing the at least one wafer in the wafer carrier 1303, the controller may control the table 1314 to unload the wafer carrier 1303 from the aligned buffering space. It can be understood that since there are multiple wafer carriers buffered in the buffering spaces of the MCLP waiting for wafer processing, the previously aligned buffering space may be misaligned with the table 1314. In this case, the controller may first control the buffering spaces to move up or down along the A1 direction to realign the previously aligned buffering space with the table 1314, before controlling the table 1314 to unload the wafer carrier 1303 from the realigned buffering space.

As shown in FIG. 13, the load port 1301 further includes a plurality of key-switches 1316. Different components of the load port 1301 may be configured to operate based on a pressed signal generated by any of the key-switches 1316.

Figure 14:
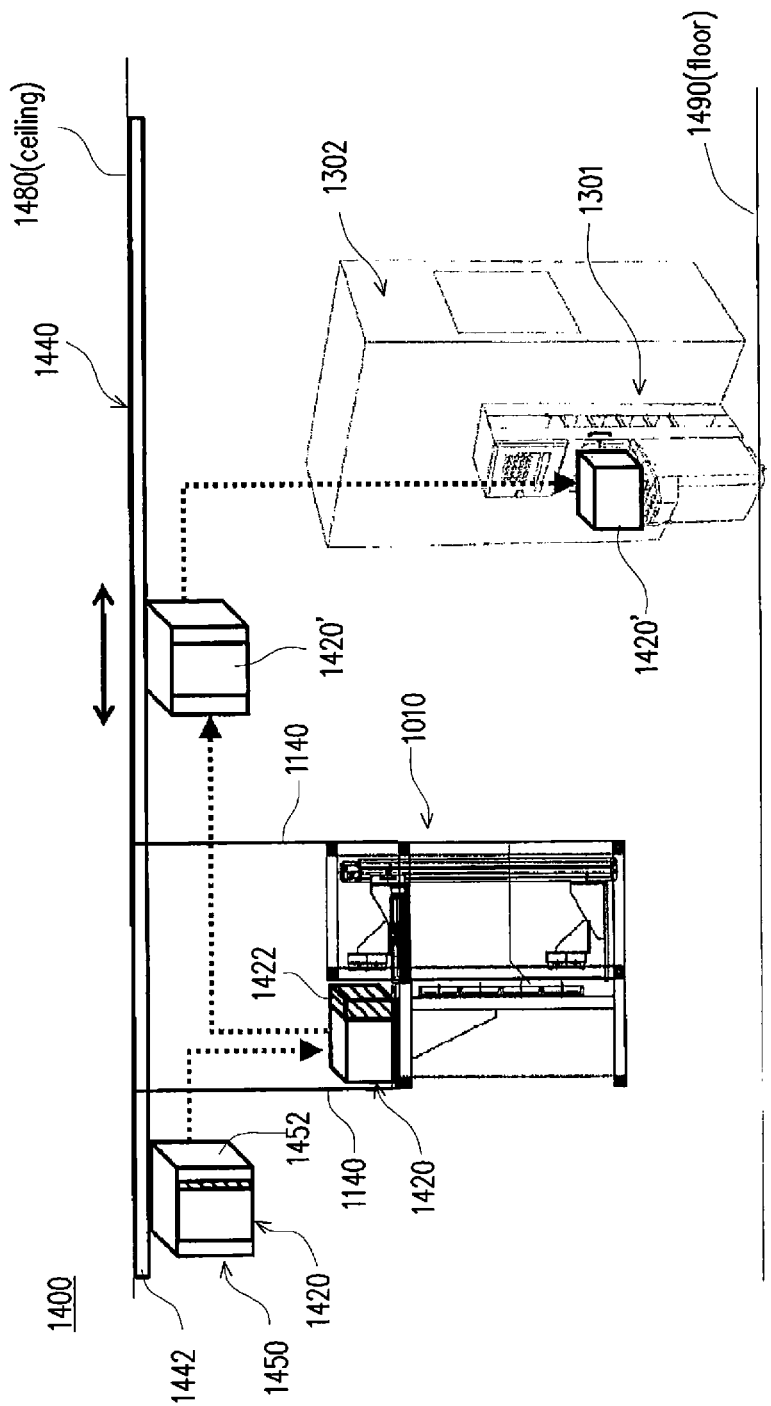
FIG. 14 illustrates a portion of a semiconductor FAB including a transport tool, a sky port and a load port, in accordance with some embodiments of the present disclosure.

FIG. 14 illustrates a portion of a semiconductor FAB 1400 including a transport tool 1440, a sky port 1010 and a load port 1301, in accordance with some embodiments of the present disclosure. The portion of the FAB 1400 shown in FIG. 14 may be a schematic perspective diagram of an automatic material handling system (AMHS). As shown in FIG. 14, the AMHS includes a wafer transport tool 1440, e.g. an OHT system, a sky port 1010 that may be a sky port as disclosed above in accordance with FIGS. 10-12, and a load port 1301 that may a load port as disclosed above in accordance with FIG. 13, e.g. an MCLP.

In one example, the OHT system 1440 includes a network of stationary tracks or rails 1442 operable to guide the movement of one or more wheeled OHT vehicles 1450 supported and suspended from the rails 1442. In some embodiments, the rails 1442 are monorails that are mounted to and suspended from the ceiling 1480 and/or walls of the FAB. Rails 1442 have any suitable cross-sectional configuration as will be appreciated by those in the art so long as the OHT vehicle 1450 are appropriately supported from the rail 1442 for rolling motion.

An OHT vehicle 1450 is operable to transport a wafer carrier 1420, 1420' through the FAB 1400 for intra-bay or inter-bay movement. The OHT vehicle 1450 is configured and structured to hold a wafer carrier 1420, 1420' housing a plurality of wafers and transport the wafer carrier 1420, 1420' in a generally horizontal or lateral direction from one location to another within the FAB 1400.

The OHT vehicle 1450 is configured and operable to pick up, raise/lower, hold, articulate, and release a wafer carrier 1420, 1420'. In one embodiment, the OHT vehicle 1450 includes a motor-driven or pneumatic hoisting mechanism 1452 generally comprised of gripper assembly including one or more retractable and extendable gripper arms having a gripper on the end thereof configured for locking onto a mating hook or flange on the wafer carrier 1420, 1420'. The hoisting mechanism 1452 is operable to vertically raise and lower the gripper and attached wafer carrier 1420, 1420'.

As shown in FIG. 14, the OHT vehicle 1450 can hold the wafer carrier 1420 having a door 1422, transport the wafer carrier 1420 along the rail 1442, and release the wafer carrier 1420 onto the table of the sky port 1010. The sky port 1010 can automatically open and store the door 1422 of the wafer carrier 1420, in a manner similar to what have been described in FIGS. 10-12. The sky port 1010 is physically coupled to the ceiling 1480 by one or more holding mechanisms 1140, to save floor area of the FAB 1400.

After the door 1422 is stored at the sky port 1010, the OHT vehicle 1450 may pick up the opened wafer carrier 1420' and transport the opened wafer carrier 1420' to the load port 1301 that can load the opened wafer carrier 1420' for a processing tool 1302 to process at least one wafer in the opened wafer carrier 1420'. In this example, the processing tool 1302 is coupled to the load port 1301. Both the load port 1301 and the processing tool 1302 are located on the floor 1490 of the FAB 1400.

In some embodiments, there are multiple processing tools in the FAB 1400, and each processing tool is coupled to a corresponding load port that is a load port as disclosed above in accordance with FIG. 13. In this situation, after the at least one wafer in the wafer carrier 1420 is processed and the door 1422 of the wafer carrier 1420 is closed back by the sky port 1010, the OHT vehicle 1450 can pick up the wafer carrier 1420 from the sky port 1010 and transport the wafer carrier 1420 to a next sky port and a corresponding next load port for additional wafer processing at the processing tool coupled to the next load port.

Figure 15:
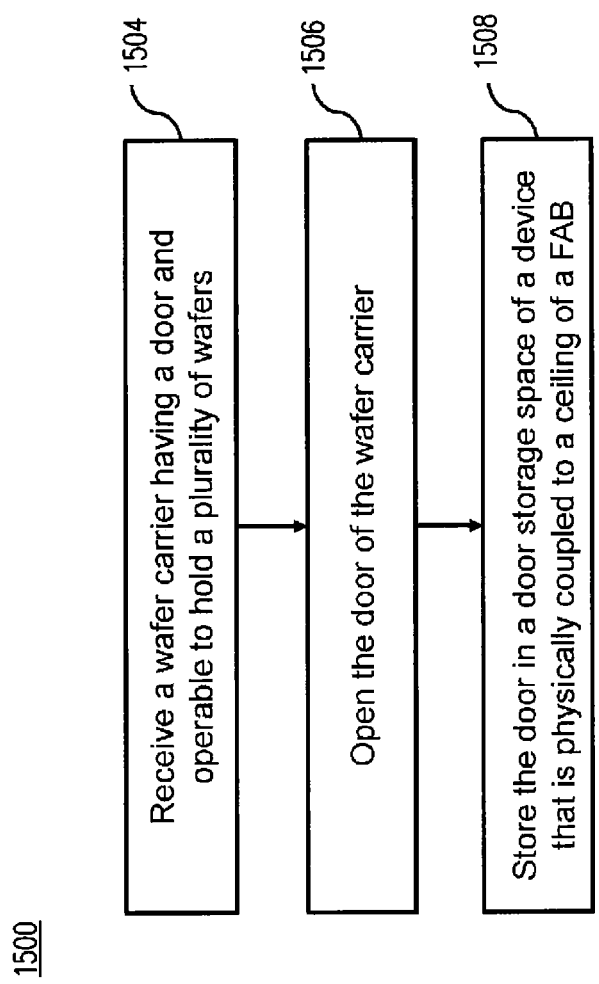
FIG. 15 is a flow chart illustrating an exemplary method for handling wafer carriers, in accordance with some embodiments of the present disclosure.

FIG. 15 is a flow chart illustrating an exemplary method 1500 for handling wafer carriers, in accordance with some embodiments of the present disclosure. As shown in FIG. 15, a wafer carrier having a door and operable to hold a plurality of wafers, is received at 1504. The door of the wafer carrier is opened at 1506. The door is stored at 1508 in a door storage space of a device that is physically coupled to a ceiling of a FAB.

Figure 16:
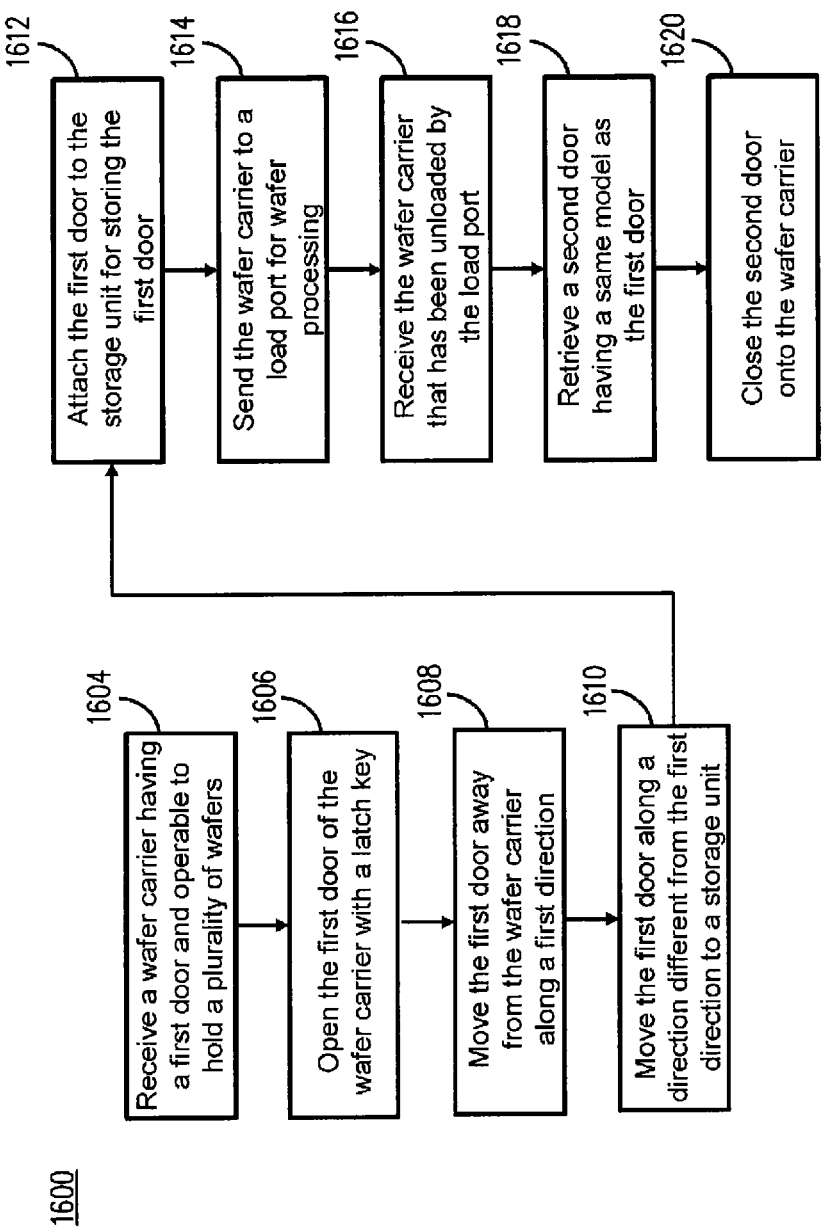
FIG. 16 is a flow chart illustrating another exemplary method for handling wafer carriers, in accordance with some embodiments of the present disclosure.

FIG. 16 is a flow chart illustrating another exemplary method 1600 for handling wafer carriers, in accordance with some embodiments of the present disclosure. As shown in FIG. 16, a wafer carrier having a first door and operable to hold a plurality of wafers, is received at 1604. The first door of the wafer carrier is opened with a latch key at 1606. The first door is moved away at 1608 from the wafer carrier along a first direction. The first door is moved at 1610 along a direction different from the first direction to a storage unit. As discussed above, the storage unit may be included in a device that is physically coupled to a ceiling of a FAB.

The first door is attached at 1612 onto the storage unit in the device for storing the first door. At 1614, the wafer carrier is sent to a load port for wafer processing. The wafer carrier that has been unloaded by the load port is received at 1616. A second door having a same model as the first door is retrieved at 1618. The second door is closed at 1620 onto the wafer carrier.

It can be understood that the order of the steps shown in each of FIG. 15 and FIG. 16 may be changed according to different embodiments of the present disclosure.

In an embodiment, an apparatus for handling wafer carriers in a semiconductor fabrication facility (FAB) is disclosed. The apparatus includes: a table configured to receive a wafer carrier having a first door and operable to hold a plurality of wafers; an opening mechanism configured to open the first door of the wafer carrier; and a door storage space configured to store the first door.

In another embodiment, a method for handling wafer carriers by a device located on a floor of a FAB is disclosed. The method includes: receiving a wafer carrier having a first door and operable to hold a plurality of wafers; opening the first door of the wafer carrier; storing the first door in a door storage space of the device; and loading the wafer carrier whose door has been stored in the door storage space, into a processing tool to process at least one wafer in the wafer carrier.

In yet another embodiment, a method for handling wafer carriers by a device in a FAB is disclosed. The method includes: receiving a wafer carrier having a first door and operable to hold a plurality of wafers; opening the first door of the wafer carrier; and storing the first door in a door storage space of the device. The device is physically coupled to a ceiling of the FAB.

In still another embodiment, a wafer handling system in a FAB is disclosed. The wafer handling system includes: a device that is coupled to a ceiling of the FAB, a load port, and a transport tool. The device is physically coupled to a ceiling of the FAB, and includes: a table configured to receive a wafer carrier having a first door and operable to hold a plurality of wafers, an opening mechanism configured to open the first door of the wafer carrier, and a door storage space configured to store the first door. The load port is configured to receive the wafer carrier whose door has been stored in the storage space, and load the wafer carrier for a processing tool to perform a semiconductor manufacturing process on at least one wafer in the wafer carrier. The transport tool is configured to transport the wafer carrier between the device and the load port.

In a different embodiment, a wafer handling system in a FAB is disclosed. The wafer handling system includes: a load port that is located on a floor of the FAB, a transport tool physically coupled to a ceiling of the FAB, and a processing tool physically coupled to the load port. The load port includes: a table configured to receive a wafer carrier having a first door and operable to hold a plurality of wafers, an opening mechanism configured to open the first door of the wafer carrier, a door storage space configured to store the first door, and a controller configured to control the table to load the wafer carrier whose door has been stored in the door storage space. The transport tool is configured to transport the wafer carrier to the load port. The processing tool is configured to process at least one wafer in the loaded wafer carrier.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An Apparatus for handling wafer carriers in a semiconductor fabrication facility (FAB), comprising:
   a table configured to receive a wafer carrier having a first door and operable to hold a plurality of wafers;
   an opening mechanism configured to open the first door of the wafer carrier;
   a door storage space configured to store the first door;
   a housing comprising an input gateway configured for the wafer carrier to pass through; and
   a controller configured to control the table to move the wafer carrier through the input gateway and into a buffering space, wherein the buffering space is configured for a processing tool to process at least one wafer contained in the wafer carrier, wherein:
   the wafer carrier is lowered by the transport tool onto a top surface of the table; and
   wherein the controller is further configured to control the table to load the wafer carrier whose door has been stored in the door storage space, into a processing tool to process at least one wafer in the wafer carrier.

2. The apparatus of claim 1, wherein:
   the controller is further configured to control the table to unload the wafer carrier after the at least one wafer is processed; and
   the apparatus further comprises a closing mechanism configured to
      retrieve a second door having a same model as the first door from the door storage space, and
      close the second door onto the wafer carrier that has been unloaded.

3. The apparatus of claim 1, further comprising:
   a light shutter located over the table and configured to capture light information of a wafer transport path between the light shutter and the table; and
   a first sensor configured to determine whether there is an obstacle on the wafer transport path based on the light information, wherein the first sensor is further configured to inform a second sensor on the transport tool when there is an obstacle on the wafer transport path, to stop the transport tool from transporting wafer carriers to the apparatus.

4. The apparatus of claim 1, wherein the opening mechanism comprises:
   a vacuum pin configured to hold the first door;
   a latch key configured to open the first door; and
   a moving mechanism configured to move the first door away from the wafer carrier along a first direction, wherein:
   the door storage space includes at least one storage unit for door storage; and
   the moving mechanism is further configured to:
      move the first door, along a second direction that is different from the first direction, to the at least one storage unit that is not attached with any door, and
      attach the first door to the at least one storage unit by an alignment pin.

5. The apparatus of claim 4, further comprising:
   a plurality of buffering spaces configured to buffer wafer carriers, whose doors have been opened and stored in the door storage space, before any wafer in the buffered wafer carriers is processed by the processing tool; and
   a controller configured to control the table to move the wafer carrier into one of the plurality of buffering spaces along at least one of: the first direction and a third direction that is different from the first direction.

6. The apparatus of claim 1, further comprising one or more holding mechanisms configured to hold the apparatus to the ceiling of the FAB.

7. The apparatus of claim 1, wherein the apparatus is associated with a processing tool configured to perform a semiconductor manufacturing process on at least one wafer in the wafer carrier.

8. The apparatus of claim 1, the table is configured to receive the wafer carrier from vehicle that is physically coupled to a ceiling of a room in which the apparatus is located.

9. The apparatus of claim 1, further comprising a sensor to detect an object located on a transport path of the wafer carrier.

10. A method for handling wafer carriers by a device located on a floor of a FAB, comprising:
receiving a wafer carrier having a first door and operable to hold a plurality of wafers, wherein the wafer carrier is transported by a transport tool that is physically coupled to a ceiling of the FAB and is located higher than the device;
opening the first door of the wafer carrier along a first direction;
storing the first door in a door storage space of the device;
loading the wafer carrier whose door has been stored in the door storage space, into a processing tool to process at least one wafer in the wafer carrier;
capturing light information of a wafer transport path through which the wafer carrier is received;
determining whether there is an obstacle on the wafer transport path based on the light information; and
informing the transport tool when there is an obstacle on the wafer transport path, to stop the transport tool from transporting wafer carriers to the device.

11. The method of claim 10, further comprising:
unloading the wafer carrier that has been loaded;
retrieving a second door having a same model as the first door from the door storage space, and
closing the second door onto the wafer carrier that has been unloaded.

12. The method of claim 10, further comprising:
moving the wafer carrier, along at least one of: the first direction and a second direction that is different from the first direction, into a buffering space in the device; and
buffering the wafer carrier, whose door has been opened and stored in the door storage space, in the buffering space before any wafer in the wafer carrier is processed.

13. The method of claim 12, wherein:
a controller controls a table upon which the wafer carrier rests to move the wafer carrier into the buffering space.

14. The method of claim 10, wherein:
opening the first door further comprises:
holding the first door,
opening the first door when the first door is being held, and
moving the first door away from the wafer carrier along the first direction;
the door storage space includes at least one storage unit for door storage.

15. The method of claim 14, further comprising:
moving the first door, along a third direction that is different from the first direction, to the at least one storage unit that is not attached with any door; and
attaching the first door onto the at least one storage unit.

16. A method for handling wafer carriers by a device in a FAB, comprising:
receiving a wafer carrier having a first door and operable to hold a plurality of wafers;
opening the first door of the wafer carrier;
storing the first door in a door storage space of the device; and
moving the wafer carrier through an input gateway of the device into a buffering space of the device, wherein the buffering space is configured for a processing tool to process at least one wafer contained in the wafer carrier.

17. The method of claim 16, wherein the wafer carrier is configured to be loaded by a load port for the processing tool to perform a semiconductor manufacturing process on the at least one wafer in the wafer carrier.

18. The method of claim 17, further comprising:
receiving the wafer carrier that has been unloaded by the load port after wafer processing;
retrieving a second door having a same model as the first door from the door storage space; and
closing the second door onto the wafer carrier that has been unloaded by the load port.

19. The method of claim 16, wherein:
opening the first door of the wafer carrier comprises:
holding the first door,
opening the first door when the first door is being held, and
moving the first door away from the wafer carrier along a first direction;
the door storage space includes at least one storage unit for door storage; and
the method further comprises:
moving the first door, along a second direction that is different from the first direction, to the at least one storage unit that is not attached with any door, and
attaching the first door to the at least one storage unit by an alignment pin.

20. The method of claim 19, further comprising loading the wafer carrier whose door has been stored in the door storage space into the processing tool for processing.

* * * * *